United States Patent [19]

Hughes et al.

[11] Patent Number: 4,908,242
[45] Date of Patent: Mar. 13, 1990

[54] METHOD OF CONSISTENTLY PRODUCING A COPPER DEPOSIT ON A SUBSTRATE BY ELECTROLESS DEPOSITION WHICH DEPOSIT IS ESSENTIALLY FREE OF FISSURES

[75] Inventors: Rowan Hughes, Bedford, Ohio; Milan Paunovic, Port Washington; Rudolph J. Zeblisky, Hauppauge, both of N.Y.

[73] Assignee: Kollmorgen Corporation, Simsbury, Conn.

[21] Appl. No.: 187,821
[22] Filed: Apr. 29, 1988

Related U.S. Application Data

[63] Continuation-in-part of Ser. No. 926,363, Oct. 31, 1986, abandoned.
[51] Int. Cl.⁴ .............................................. B05D 1/18
[52] U.S. Cl. ................................. 427/443.1; 427/436; 427/437; 106/1.23; 106/1.26
[58] Field of Search ...................... 427/443.1, 436, 347; 106/1.23, 1.26

[56] References Cited

U.S. PATENT DOCUMENTS

| | | | |
|---|---|---|---|
| 3,095,309 | 6/1963 | Zeblisky et al. | 106/1 |
| 3,257,213 | 6/1966 | Schneble et al. | 106/1 |
| 3,310,430 | 3/1967 | Schneble et al. | 117/130 |
| 3,361,580 | 2/1968 | Schneble et al. | 106/1 |
| 3,436,233 | 4/1969 | Jackson | 106/1 |
| 3,454,416 | 7/1969 | Heymann et al. | 117/47 |
| 3,485,643 | 12/1969 | Zeblisky et al. | 106/1 |
| 3,492,135 | 1/1970 | Clauss | 106/1 |
| 3,532,519 | 10/1970 | Hirohata et al. | 106/1 |
| 3,607,317 | 9/1971 | Schneble | 427/443.1 |
| 3,615,732 | 10/1971 | Shipley et al. | 106/1 |
| 3,645,749 | 2/1972 | Paunovic | 106/1 |
| 3,663,242 | 5/1972 | Gulla | 427/306 |
| 3,804,638 | 4/1974 | Jonker et al. | 106/1 |
| 3,843,373 | 10/1974 | Molenaar et al. | 106/1 |
| 3,844,799 | 10/1974 | Underkofler et al. | 106/1 |
| 4,099,974 | 7/1978 | Morishita et al. | 106/1.23 |
| 4,132,605 | 1/1979 | Tench et al. | 204/1 |
| 4,146,437 | 3/1979 | O'Keefe | 204/1 |
| 4,182,638 | 1/1980 | Cooke | 148/6 |
| 4,301,196 | 11/1981 | McCormack | 427/443.1 |
| 4,331,699 | 5/1982 | Suzuki et al. | 427/8 |
| 4,336,111 | 6/1982 | Graunke | 204/1 |
| 4,406,250 | 9/1983 | Araki et al. | 118/690 |
| 4,479,980 | 10/1984 | Acosta et al. | 427/10 |
| 4,499,852 | 2/1985 | Castner | 118/690 |
| 4,548,644 | 10/1985 | Nakaso et al. | 106/1.23 |
| 4,557,762 | 10/1985 | Nakaso et la. | 106/1.23 |
| 4,565,575 | 1/1986 | Cardin et al. | 106/1.22 |
| 4,623,554 | 11/1986 | Kaschak et al. | 427/10 |
| 4,626,446 | 12/1986 | Capwell et al. | 427/8 |
| 4,632,852 | 12/1986 | Akahoshi et al. | 427/437 |
| 4,650,691 | 3/1987 | Kinoshita et al. | 427/8 |

FOREIGN PATENT DOCUMENTS 0180090  5/1986  European Pat. Off. .
1588758  4/1981  United Kingdom .

OTHER PUBLICATIONS

M. Pannovic, "Electrochemical Aspects of Electroless Deposition of Metals" Plating, Nov. 1968, pp. 1161-1167.
Costa I. Cornduvelis et al., "Accumulation of By Products in Electroless Copper Plating Solutions" Plating and Surface Finishing, Sep. 1980, pp. 71-76.
Francis M. Donahue et al., "Kinetics of Electroless Copper Plating IV Empirical Rate Law for $H_2CO$--EDTA Baths" J. Electrochem. Soc. Nov. 1980, pp. 2340-2341.
Grunwald, Rhodenizer and Slominski, Plating, vol. 58, 1004 (1970).

Primary Examiner—Shrive Beck
Assistant Examiner—Vi Duong Dang
Attorney, Agent, or Firm—Morgan & Finnegan

[57] ABSTRACT

Electroless metal plating solutions are formulated and controlled to provide high quality metal deposits by establishing the intrinsic cathodic reaction rate of the solution less than 110% of the intrinsic anodic reaction rate. Methods are provided to formulate electroless copper plating solutions which can deposit copper on printed wiring boards of quality sufficient to pass a thermal stress of 10 seconds contact with molten solder at 288° C. without cracking the copper deposits on the surface of the printed wiring boards or in the holes. The ratio of the anodic reaction rate to the cathodic reaction rate can be determined by electrochemical measurements, or it can be estimated by varying the concentration of the reactants and measuring the plating rates.

42 Claims, 1 Drawing Sheet

METHOD OF CONSISTENTLY PRODUCING A COPPER DEPOSIT ON A SUBSTRATE BY ELECTROLESS DEPOSITION WHICH DEPOSIT IS ESSENTIALLY FREE OF FISSURES

CROSS REFERENCE TO RELATED APPLICATIONS

This application is a continuation-in-part or our U.S. application Ser. No. 06/926,363 filed Oct. 31, 1986, now abandoned.

BACKGROUND OF THE INVENTION

Electroless metal deposition solutions comprise metal ions and a reducing agent for the metal ions. The reducing agent oxidizes on a catalytic surface, and provides electrons to the surface. These electrons, in turn, reduce the metal ions to the metal on the surface. This process may be written in the form of a chemical equation:

$$Red + Me^{n+} = Ox + Me^{o}.$$

The term Red means the reducing agent, $Me^{n+}$ refers to the metal ion, Ox means the oxidized form of the reducing agent and $Me^{o}$ refers to the reduced metal. This equation can be split into equations describing the two half reactions:

$$Red = Ox + ne^{-}, \text{ and}$$

$$Me^{n+} + ne^{-} = Me^{o}$$

where n is the valence of the metal ion and $e^{-}$ designates an electron.

In many electroless copper deposition solutions the reducing agent, Red, is an alkaline formaldehyde, an aqueous formaldehyde solution with a pH between 10 and 14. In the case of alkaline formaldehyde, Ox would be formate ion. $Me^{n+}$ refers to the metal ion, e.g., a copper (II) ion, and $Me^{o}$ refers to the metal, copper. These general equations may be rewritten more specifically for a system with copper ions and alkaline formaldehyde as:

$$2HCHO + 4OH^{-} = 2HCOO^{-} + 2H_2O + H_2 + 2e^{-},$$
and $$CuL^{n+2} + 2e^{-} = Cu^{o} + L^{n}.$$

L designates the ligand necessary to prevent precipitation of basic copper compounds in alkaline solution and n refers to the valence of the ligand ion.

The half reaction of formaldehyde with hydroxide to produce electrons does not take place homogeneously in the bulk solution. It is a heterogeneous reaction which takes place on catalytic conductive surfaces such as copper. This reaction is called an anodic reaction. The half reaction for copper ions from the copper-ligand complex to copper metal is known as the cathodic reaction.

At the thermodynamic equilibrium, the rate of the anodic reaction, in the forward direction, $$Red = Ox + e^{-},$$

is equal and opposite the rate of the same reaction in the opposite direction, $$Ox + e^{-} = Red;$$

and the potential of the electrode surface is the equilibrium potential. When the potential of the electrode surface is shifted to a more positive potential either by imposing a potential on the electrode from an external power supply, or by a second reaction with a more positive equilibrium potential simultaneously taking place on the same electrode, the rate of the forward reaction is no longer in equilibrium with the rate of the reverse reaction. The rate of the forward reaction increases or decreases as a function of the shift of the potential away from the thermodynamic equilibrium potential.

In many electrochemical processes, the anodic and cathodic reactions take place on separate electrodes, the anode and the cathode. In electroless metal deposition, the anodic and cathodic reactions take place on the same surface, so that at any instant one point on the surface may be considered anodic and another point on the surface considered cathodic, and the rate of the anodic reaction may be assumed to be equal to the rate of the cathodic reaction, with the electrons produced in the anodic reaction consumed in the cathodic reaction. In electroless metal deposition, the cathodic reaction, $$Me^{n+} + ne^{-} = Me^{o},$$

taking place on the same electrode with the anodic reaction shifts the anodic reaction to more positive potential (and the cathodic reaction to a potential more negative than its thermodynamic equilibrium potential). The potential where both the forward anodic and cathodic reactions are proceeding without an external voltage supply is a mixed potential, $E_{mp}$, and is the deposition potential for electroless deposition.

At the mixed potential, the rates of the anodic and cathodic reactions are equal to each other, and can be measured as the deposition rate of the metal as $mg/cm^2/hr$ which by Faraday's Law can be expressed as $mA/cm_2$.

Copper deposits on substrates produced by electroless deposition or electroless deposition reinforced by electroplating are an important part of many processes used for the manufacture of printed circuits. Additive or fully additive printed wiring boards are made with a process which uses 100% electrolessly formed copper.

A specification, Mil Spec. P-55110-D, describes tests which measure the performance of printed circuits when subjected to conditions and environments the printed circuits will be exposed to during manufacture and use. In order to provide reliable printed circuits, the criteria for printed circuits in military and some commercial applications are based on the ability to meet the requirements of this specification.

Heretofore, electroless copper deposits on FR-4 epoxy glass material using the fully-additive method of making printed circuits have not been able to pass the Mil. Spec. P-55110-D thermal stress test. When exposed to this test, the plated-through holes would fracture during the 10-second exposure to the molten solder, usually at the intersections of the hole wall with the surface, the corners of the holes. These fractures (corner cracks) would usually fill with solder providing good electrical conductivity through the hole, but the integrity of the copper deposits were suspect and not acceptable for many applications. Although it is desirable to pass the Military thermal stress test, this has proved to be a difficult test to continuously pass in a production environment when manufacturing printed circuits using the additive method (electrolessly plated copper deposits) or the subtractive method (electroplated copper deposits). On the other hand, this test has been found to reliably predict performance of circuit boards under stress conditions encountered during use.

Prior art electroless copper formulations have been empirically derived and based on specific addition agents and conditions which were difficult to control and operate on a consistent basis. Many of the addition agents are present in parts per million or per billion and difficult to analyze and control. Furthermore, trace contaminants have been difficult to detect and have had major detrimental effects on deposition quality. The resulting copper deposits although acceptable for some commercial applications, have not been of sufficient quality to have broad acceptance in the industry.

In addition to the normal by-products formed during operation, chemical contamination can enter the plating solution through chemical additions, water supplies, air or from the work placed in the electroless copper bath. Many of the inorganic contaminants, such as iron, cuprous ions, silver, gold, antimony, arsenic and many other metals and their compounds, as well as many organic contaminants, can cause deleterious results for both bath operation and the quality of the copper deposits, even when only present in parts per million concentration.

For electroless copper deposition, it has been reported by Morishita et al., U.S. Pat. No. 4,099,974, that the concentration of the anodic reactants, formaldehyde and hydroxide, above a threshold, have little effect on the copper plating rate. Therefore Morishita et al. use only anodic reactant concentrations above the threshold. Under such conditions copper ion concentration does effect the plating rate.

The same observation, that plating rate is largely independent of the concentration of the anodic reactants, but depends mainly on the copper concentration has been reported by many authors. Donahue, Wong and Balla, *J. Electrochemical Soc.*, vol. 127, p2340 (1980) summarize the data from a number of sources, showing the copper concentration is the major factor in the rate equation. In other words in electroless copper deposition solutions known and used in the art, the rate of the cathodic reaction, $CuL^{n+2} + 2e^- = Cu^o + L^n$, controls the rate of both reactions at the mixed potential.

The ductility, tensile strength and elongation needed in electroless copper plating for additive printed circuits has been widely studied. There is no agreement among the experts in the field on the numerical values of these properties necessary for additive printed circuits. However it has been widely held that these numerical values should be maximized in order to achieve additive printed circuit boards resistant to fissure formation in the copper deposits during soldering. The only common agreement that has been achieved among the experts is that the ductility of the copper deposits improves with increasing temperature of the electroless plating solution, as reported by Grunwald, Rhodenizer and Slominski, *Plating*, vol. 58, p1004 (1970).

SUMMARY OF THE INVENTION

Definitions

By the term anodic reaction rate is meant the rate of oxidation of the reducing agent on a metal surface in an electroless metal deposition solution.

By cathodic reaction rate is meant the rate of reduction of metallic ions to metal on a metallic surface in an electroless deposition solution.

By the intrinsic anodic reaction rate, $r_a'$, is meant the anodic reaction rate as measured on a metallic surface in an electroless plating solution by imposing a potential slightly more positive than the mixed potential on the metallic surface.

By the intrinsic cathodic reaction rate, $r_c'$, is meant the cathodic rate as measured on metallic surface in an electroless plating solution by imposing a potential slightly more negative than the mixed potential on the metallic surface.

By the mixed potential, $E_{mp}$, is meant the potential difference between a reference electrode and a metallic surface on which both the anodic and the cathodic reactions are proceeding, and metal is being electrolessly deposited. Unless otherwise stated, the reference electrode is a saturated calomel electrode, SCE.

By the term thermal stress test is meant a test of printed circuit specimens containing plated through holes wherein the specimens are conditioned at 120° C. to 150° C. for a period of 2 hours minimum to remove moisture; after conditioning, the specimens are placed in a dessicator on a ceramic plate to cool; the specimens are then fluxed (type RMA of MIL F-14256) and floated in a solder bath (Sn 63±5%), maintained at 288°±5° C. for a period of 10 seconds; after stressing, the specimens are placed on a piece of insulator to cool; then microsectioned in a vertical plane at the center of the hole and examined for cracks at 50 to 100 magnifications. A minimum of one microsection containing at least three holes is made for each sample tested. Any cracks forming in the copper deposit on the specimens will indicate thermal stress failure.

By an electroless plating reaction being under cathodic control is meant the cathodic reaction controls the overall plating rate, i.e., the plating rate depends on the concentration of the cathodic reactants, the concentration of the metal ions, or the concentration of depolarizers for the half reaction involving the metal ions.

By an electroless plating reaction being under anodic control is meant the anodic reaction controls the overall plating rate, i.e., the plating rate depends on the concentration of the anodic reactants, the concentration of the reducing agents for the metal ions, or depolarizers for the half reaction involving the reducing agents.

By the term high quality copper is meant copper that has small crystals with a grain size less than 10 micrometers and low frequency of crystal dislocations, defects and twinning. High quality copper on printed circuit boards will pass the thermal stress test.

When referring to electrolessly deposited copper, by the term satisfactory copper quality is meant also high quality copper.

By fissure free copper deposits is meant electroless copper deposits free from internal cracks or fissures or internal defects capable of causing cracks or fissures when the copper deposit is thermally stressed. Fissure resistant copper means copper deposits that will not form fissures or cracks when exposed to thermal stress, thermal cycling or in use.

Objects of the Invention

It is an object of this invention to provide copper metal deposits with good physical properties from electroless plating solutions.

It is also an object of this invention to provide electrolessly deposited copper for printed circuit boards which is resistant to crack formation under thermal stress testing at 288° C.

It is an object of this invention to provide highly reliable printed wiring boards.

It is a further object of this invention to provide a method of operating and maintaining an electroless copper plating solution which ensures the deposition of copper having good physical properties and being free of fissures.

It is an object of this invention to provide a method of formulating electroless copper plating solutions that are capable of depositing copper free of fissures and resistant to cracking under thermal stress.

Brief Description of the Invention

This invention is based upon the discovery that, in order to produce satisfactory copper the constituents comprising the electroless copper deposition solution are present in the solution in concentrations and under operating conditions such that, at the operating temperature of the solution, the intrinsic anodic reaction rate is not greater than the intrinsic cathodic reaction rate.

In one aspect, this invention comprises a method of monitoring and controlling electroless plating solutions to obtain electrolessly formed metal deposits of high quality, characterized in that the ratio of the intrinsic reaction rates is maintained less than 1.1 during copper deposition. In another embodiment, the invention comprises monitoring the ratio of the intrinsic anodic and cathodic reaction rates of the electroless deposition solution, and adjusting the solution composition and/or operating conditions to maintain the intrinsic anodic reaction rate less than 110% of the intrinsic cathodic reaction rate.

In yet another embodiment the invention comprises a simple method of selecting an electroless copper plating solution operating under anodic control. The alkaline electroless copper deposition solutions comprise copper ions, one or more ligands to solubilize the copper ions, a reducing agent capable of reducing the copper ions to metal, a pH adjusting compound, and additives such as stabilizers, accelerators, ductility promoters and surfactants. Solutions under anodic control can be achieved by measuring the rates of electrolessly depositing copper while varying the concentration of the anodic and/or cathodic reactants or simply by maintaining the ratio of the mole concentration of the reducing agent to the mole concentration of copper ions less that about 1.2.

These embodiments include methods of maintaining constant plating rates, and methods for increasing plating rates.

DETAILED DESCRIPTION OF THE INVENTION

Figure 1:
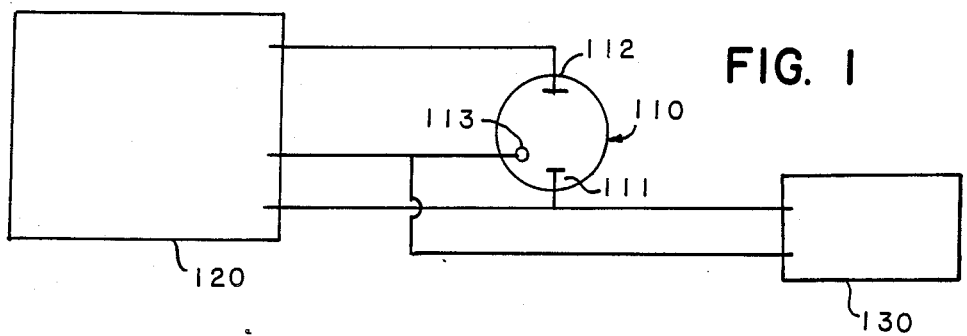
FIG. 1 is a schematic diagram of apparatus suitable for carrying out electrochemical measurements according to this invention.

While the invention will be described in the context of alkaline electroless plating bath solutions, its scope is not limited to such solutions.

There are many electroless copper plating solution formulations which will initially deposit high quality copper. However, experience has shown that as the plating baths age, the quality of the deposit deteriorates, and the bath must be replaced in whole or in part. The age of an electroless plating solution is determined by build up of plating reaction by-products and by build up of contaminants. The build up of by-products can be measured by the change in solution density or specific gravity. Under fixed operating conditions, the contaminants also will build up in proportion to the change in solution density. The teaching of this invention allows the extension of the useful life of such solutions by controlling the mole ratio of formaldehyde to copper, and increasing the copper concentrations and the pH of such solutions to obtain adequate plating rates at the desired mole ratio.

Aqueous electroless copper plating solutions for use in the processes of this invention contain copper compounds which serve as the source of copper ions to form the copper metal deposits; reducing agents which are themselves oxidized and provide the electrons necessary to reduce the copper ions to copper metal deposits; pH adjusting compounds which provide a pH suitable for reduction of the copper ions by the reducing agents; complexing agents to solubilize the copper ions at the pH of the solutions; and additives to stabilize the solution, brighten the deposits, reduce surface tension, inhibit hydrogen inclusion in and improve the ductility of the copper metal deposits.

Among the copper compounds that are suitable as sources of copper ions are copper sulfates, copper nitrates, copper halides, copper acetates, copper phosphates, copper oxides, copper hydroxides, basic copper sulfates, halides and carbonates and soluble copper complexes. Copper(II) compounds are preferred, and copper(II) sulfate and copper(II) chloride are commonly used. Another source of copper ions is metallic copper which may be electrochemically dissolved into the electroless plating solution, or electrochemically dissolved into an electrolyte and diffused through a membrane into the electroless plating solution.

The lower limit for the concentration of the copper compound in the electroless plating solution should be high enough to maintain the intrinsic cathodic reaction rate greater than 90% of the intrinsic anodic reaction rate. The upper limit is the concentration where copper metal precipitates homogeneously throughout the solution instead of only forming copper deposits on preselected catalytic surfaces. The upper limit also depends on the stabilizer additive used to control homogeneous precipitation and the substrate being plated. For most electroless copper plating bath formulations, the concentration will be set at a point above 0.01 molar and below 0.2 molar, and be increased as the bath ages by buildup of plating by-products and/or contamination.

In one embodiment of the invention, the copper concentration and the pH of the electroless plating solution are increased as the by-products and contaminants build up in the solution. In this embodiment, in order to obtain fissure free copper deposits when contaminants and/or by-products build up in the solution the copper concentration is increased 20 to 200% preferably 40 to 100% while the pH also is increased.

Among the reducing agents that are suitable for the reduction of copper ions are formaldehyde reducing agents. Formaldehyde reducing agents include compounds such as formaldehyde, formaldehyde bisulfite, paraformaldehyde, dimethyl hydantoin and trioxane. Other suitable reducing agents are boron hydrides such as boranes and borohydrides' such as alkali metal borohydrides.

The upper limit for the reducing agent in the electroless plating bath is the concentration at which the intrinsic anodic reaction rate is 110% the intrinsic cathodic reaction rate. The lower limit is the concentration at which copper plating on a clean copper surface doesn't occur, i.e., the plating solution is passive. Preferably the lower limit is the concentration at which the intrinisic anodic reaction rate is 75% to 85% of the intrinsic cathodic reaction rate. For formaldehyde reducing agents the limits depend on additives, pH and very strongly on the temperature. For most formulations, the concentration of formaldehyde will be set above 0.01 molar and below 0.25 molar and controlled between ±10% to ±30%. In solutions where the intrinsic anodic and cathodic reaction rates have not been determined, the concentration of formaldehyde will preferably be set above 0.01 molar and below 1.2 times the molar concentration of copper ions and more preferably maintained at or below the molar concentration of the copper ions.

Suitable pH adjusting compounds include the alkali metal hydroxides and copper oxide. In the operation of an alkaline, electroless copper plating solution, the pH usually drops during plating, and hydroxides are added to raise or maintain pH. If the pH needs to be lowered, an acidic compound would be used as a pH adjusting ion.

When the reducing agent is a formaldehyde reducing agent, the activity of the reducing agent depends on the pH as well as the concentration of the reducing agent. Therefore to increase the activity of the reducing agent and thus increase the intrinsic anodic reaction rate, as described herein below, either the concentration of the formaldehyde reducing agent or the concentration of the hydroxide compound (i.e., pH) may be increased.

In operating an electroless copper solution when the intrinsic anodic reaction is to be increased, preferably pH is increased, and formaldehyde concentration is held substantially constant or even decreased.

In one embodiment of this invention as the solution ages, the intrinsic cathodic reaction rate is increased by raising the copper concentration by 40 to 100 % and the anodic reaction rate is increased less than the cathodic reaction rate by raising the pH 0.1 to 1 pH unit, more preferably by 0.2 to 0.6 pH unit.

For formulations with formaldehyde type reducing agents, the pH (measured at room temperature) is usually set between 9.5 and 14. When the ratio of the mole concentration of the reducing agent to the mole concentration of the metal ion is less than about 1.2, the pH is preferably greater than 11.9, more preferably greater than 12.2.

Suitable complexing agents for electroless copper plating solutions are well known to those skilled in the art. Among the complexing agents useful for electroless copper plating solutions are ethylenedinitrilotetraacetic acid (EDTA), hydroxyethylethylenediaminetriacetic acid (HEDTA), diethylenetrinitrilopentaacetic acid (DTPA), nitrilotriacetic acid (NTA), triethanolamine, tetrakis(2-hydroxypropyl)ethylenediamine (THPED), pentahydroxypropyldiethylenetriamine, and tartaric acid and its salts (Rochelle salts). Copper deposits without fissures, and plated through hole printed circuits capable of withstanding a thermal stress of 288° C. for 10 seconds may be plated from solutions comprising these complexing agents or mixtures thereof by the methods and procedures of this invention.

Many additives have been proposed for use in electroless copper plating solutions. The additives which have been proposed may be classified by function into different groups. Most additives have more than a single effect on the electroless copper plating solutions, so classification of additives into groups may be somewhat arbitrary. There is some overlap between the additive groups, and almost all the additives affect the rate of the oxidation of the reducing agent (the anodic reaction) or the reduction of the copper ion to metal (the cathodic reaction).

One group of additives are surfactants or wetting agents to control surface tension. Anionic, nonionic, amphoteric or cationic surfactants may be used. The choice of surfactants may vary depending on the operating temperature and the ionic strength of the electroless plating solution employed. Preferably the surfactant is used at solution temperatures and ionic strengths below its cloud point. Surfactants containing polyethyoxy groups or fluorinated surfactants are preferred. Among the preferred surfactants are alkylphenoxypolyethoxy phosphates, polyethoxypolypropoxy block copolymers, anionic perfluoroalkyl sulfonates and carboxylates, nonionic fluorinated alkyl alkoxylates and cationic fluorinated quaternary ammonium compounds.

A second group of additives are stabilizers which prevent the spontaneous decomposition of the plating solution and/or the formation of undesired copper deposits outside of, or extraneous to, the desired deposit, so called "extraneous copper". Among the additives that have found use as stabilizers and to inhibit extraneous copper are oxygen (e.g., oxygen added to the plating solution by stirring or air agitation of the solution), divalent sulfur compounds (e.g., thiols, mercaptans, and thioethers), selenium compounds (e.g., selenocyanates), covalent mercury compounds (e.g., mercuric chloride and phenylmercury), and copper(I) complexing agents (e.g., cyanides, 2,2'-dipyridyl and 1,10-phenanthrolines).

A third group of additives may be classified as ductility promoters and/or additives to retard hydrogen inclusion in the deposit. This group would include polyalkylene ethers, cyanides, nitriles, compounds of vanadium, arsenic, antimony and bismuth, nickel salts, 2,2'-dipyridyl, 1,10-phenanthrolines and some organic silicones.

The ductility promoters also act as stabilizers and are used alone or in combination with other stabilizers. Suitable concentrations for various stabilizers and ductility promoters have been described by Zeblisky et al., U.S. Pat. No. 3,095,309; Schneble et al., U.S. Pat. Nos. 3,571,215, 3,310,430 and 3,361,580; Zeblisky et al., U.S. Pat. No. 3,485,643; Schneble, U.S. Pat. No. 3,607,317; Underkofler et al., U.S. Pat. No. 3,844,799; Heymann et al., U.S. Pat. No. 3,454,416; Clauss, U.S. Pat. No. 3,492,135; Gulla et al., U.S. Pat. No. 3,663,242; Shipley et al., U.S. Pat. No. 3,615,732; Jonker et al., U.S. Pat. No. 3,804,638; Molenaar et al., U.S. Pat. No. 3,843,373; Morishita et al., U.S. Pat. No. 4,099,974; Nakaso et al., U.S. Pat. No. 4,548,644; and Nakaso et al., U.S. Pat. No. 4,557,762.

The amount of stabilizer and/or ductility promotor in the electroless copper plating solution depends on the stabilizers or ductility promoters selected and on the concentration of copper ions, reducing agent and pH. The concentrations range between 0.01 and 100 mg/l. Jackson, U.S. Pat. No. 3,436,233, describes some stabilizers that are used in even larger quantities up to 2 g/l. In general stabilizers and/or ductility promotors should be present in the electroless plating solution in an amount sufficient to prevent extraneous plating, i.e. plating on masks or resists, and substantially less than the amount that would cause passivation of metal surfaces being plated or that would stop the plating reaction.

A fourth class of additives is the group of plating rate accelerators (also known as depolarizers) as taught by McCormack et al., U.S. Pat. No. 4,301,196, which is incorporated herein by reference. These accelerating agents are compounds containing delocalized pi bonds such as heterocyclic aromatic nitrogen and sulfur compounds, aromatic amines and non-aromatic nitrogen compounds having at least one delocalized pi bond.

Preferably, the depolarizing or accelerating agent will be present in a small effective amount, i.e., generally at least about 0.0001 to about 2.5 grams per liter, more specifically about 0.0005 to 1.5 grams per liter and preferably from about 0.001 to about 0.5 grams per liter. In general, the amount of depolarizing or accelerating agent used will vary depending upon the particular agent employed and the formulation of the solution.

Electrolessly deposited copper in plated through holes must be thick enough to pass thermal stress and thermal cycling tests. The minimum thickness is about 10 micrometers, and preferably is at least 15% of the height of the plated through hole. Preferably, the copper thickness is at least 17% of the height of the plated through hole and more preferably, at least 20%.

Although electrolessly deposited copper has been known for many years to be inferior to electrolytically deposited copper in resistance to thermal stress, ductility and other physical properties, surprisingly it has been found that if electroless copper deposition solutions are formulated and controlled to have an intrinsic anodic reaction rate less than 110% of the intrinsic cathodic reaction rate, copper deposits with superior physical properties, including resistance to thermal stress, may be obtained.

While not wishing to be bound by theory, it is postulated that when the electroless plating solution is under cathodic control, copper crystals grow rapidly with defects or dislocations trapped within the crystals. The plating solution is under cathodic control when the intrinsic anodic plating rate is much greater than the intrinsic cathodic plating rate, i.e. the rate of the cathodic reaction controls the rate of the anodic reaction. It is assumed, since the intrinsic anodic reaction is faster, that the slow step in the plating reaction is diffusion of copper ions on the surface being plated, and electrons are readily available for reducing the copper in the cathodic reaction. So the copper is rapidly incorporated into the crystal without time to reach the correct place for integration into the lattice. When, according to this invention, the plating reactions are under anodic control (the intrinsic cathodic reaction is greater than the intrinsic anodic reaction) electrons are less available and in the cathodic reaction the incorporation of copper atoms on the surface into a copper crystal proceeds in a more uniform manner. Uniform structure in the crystals, and smaller crystal structure provide improved physical properties including resistance to thermal stress.

In electrocrystallization, which is the science of depositing metal by electroplating, it is well understood that metal ions constantly are adsorbed on and desorbed from a metal in contact with a solution of its ions. When the metal is in equilibrium with the solution of its ions, and no net deposition of metal is taking place, the rate of metal ions moving to and from the metal surface may be electrochemically measured as an exchange current density, $i_o$. The exchange current density varies with temperature and increases with any increase in the metal ion concentration in the solution, which also increases the concentration of adsorbed metal ions, called adions. When a metal is in equilibrium with a solution containing complexed metal ion, the exchange current density and the equilibrium adion concentration will vary with the strength and lability of the ligand-metal ion bond. Adions randomly migrate about the metal surface until they either move back into the solution or are incorporated into the metal crystal lattice. When adequate time is available for the random migration of adions, adions are preferentially incorporated into the crystal lattice at lattice vacancies which occur at edges or steps in the metal lattice. These sites for incorporating adions into the lattice are often called kink sites.

When electrodeposition is taking place more metal ions move onto the metal surface than are moved back from the metal surface into the solution by the exchange current density. These adions are incorporated into the metal lattice and stay there forming the metal deposit. The measured current, $i$, in an electrodeposition reaction is the current in the forward direction, $i_f$, of ions from the solution becoming adions, less the reverse current, $i_b$, the exchange current density of adions moving back into the solution.

A similar model applies to electroless metal deposition. In electroless metal deposition the measured current is supplied by the reducing agent, and the current density may be considered by Faraday's Law as proportional to the moles of reducing agent consumed per unit area per second.

According to the theory, in this invention the limiting factor for producing electrolessly formed copper deposits of high quality as exemplified by being capable of passing the thermal stress test is the average time needed for an adion to migrate to a low energy lattice site for incorporation into the lattice. This time decreases with (a) the concentration of adions, (b) the density of low energy kink sites, and (c) the temperature. The time increases with (a) the number of sites blocked, e.g., by contaminants, by the reducing agent or by additives, and (b) the tightness of the metal complex. When the current density due to the reaction of the reducing agent is sufficiently high, the time available for adions to migrate along the surface falls below the average time needed to reach a low energy lattice site, and some of the adions are incorporated into the deposit in other places forming dislocations or defects, and thus stressed and defective crystals.

The maximum rate of deposition for low defect crystals is a function of the metal adion availability and the density of low energy kink sites on the surface, and thus the intrinsic rate of the cathodic reaction (reduction of metal ion and incorporation into the lattice). Thus the corresponding oxidation reaction must be controlled to maintain a current density which is sufficiently low and permits the formation of low defect crystals. Measuring the intrinsic reaction rates for the two half reactions and establishing that the intrinsic anodic rate does not exceed the intrinsic cathodic rate, assures the formation of high quality deposits with low defects and thus capable of passing the thermal stress test.

The intrinsic rate ratio can be determined by measuring the reaction rates for the two half reactions in the neighborhood of the mixed potential, e.g., at +10 mV for the one and at −10 mV for the other half reaction; or by sweeping the potential on the one and the other side of the mixed potential and measuring the current.

In one method of operating this invention, the intrinsic anodic reaction rate at the mixed potential is estimated from the current required to vary the potential on a working electrode which is electrolessly depositing copper. The potential between the working electrode and a reference electrode is varied in a potential ramp between $E_{mp}$ and +30 mV from $E_{mp}$ by passing current between the working electrode and a counter electrode and simultaneously measuring the potential and the anodic current as the potential changes. Alternatively, if the counter electrode is at $E_{mp}$ and very much larger than the working electrode, it can also serve as a reference electrode since the current passed between it and the working electrode would be too small to shift the counter electrode potential. The intrinsic anodic reaction rate at $E_{mp}$ may be determined from the slope of a current vs. voltage plot as it approaches $E_{mp}$.

Similarly the intrinsic cathodic reaction rate may be determined from the slope of the current vs. voltage plot between −30 mV from $E_{mp}$ and $E_{mp}$.

When the intrinsic cathodic deposition rate is maintained greater than the intrinsic anodic deposition rate, or when the ratio of the intrinsic anodic deposition rate to the intrinsic cathodic deposition rate, $r'_a/r'_c$, is less than 1.1, preferably less than 1.05, and more preferably less than 1.0, it has been found that copper with superior physical properties is deposited. In order to maintain the desired ratio, it may be desirable to increase the rate of the intrinsic cathodic reaction more than an increase in the rate of the intrinsic anodic reaction.

Among the methods for increasing the rate of the intrinsic cathodic reaction are (1) raising the concentration of the cathodic constituent i.e., the metal ion concentration; (2) addition of a catalyst or depolarizer to accelerate the cathodic reaction; (3) increasing the surface area available for the cathodic reaction (e.g., by reducing the contaminants or the stabilizer concentration and the surface area blocked by contaminants or stabilizer; this may be accomplished by diluting the solution with fresh solution or by carbon treatment of the solution to remove contaminants blocking the surface area available for the cathodic reaction). When the metal ion concentration becomes too high, extraneous metal deposition in the bulk of the solution or outside the desired metal pattern may be observed. For many electroless copper plating solutions, this occurs at copper ion concentrations above the range of 0.08-0.12 moles per liter.

As electroless plating solutions build up by-products and contamination, the Ratio usually will increase. The Ratio, $r_a/r_c$, also may be maintained less than 1 while increasing both the anodic and cathodic reaction rates by increasing the rate of the intrinsic anodic reaction less than an increase in the cathodic reaction. The rate of the intrinsic anodic reaction may be increased by (1) decreasing the concentration of the reducing agent (i.e., by lower formaldehyde) while increasing the pH; or (2) increasing the concentration of anodic depolarizers such as heterocyclic aromatic nitrogen or sulfur compounds. If the concentration of the formaldehyde is lowered too much, the $E_{mp}$ of the solution may rise by 50-200 mV and the solution becomes passive i.e., there is no electroless deposition. Frequently, the solution will become active again at a higher temperature. It has been found that to increase the concentration of the anodic reactants, the product of the formaldehyde concentration and the square root of the hydroxide ion concentration, $[CH_2O][OH^-]^{0.5}$, must be increased. Although the formaldehyde may be decreased, held constant, or increased, the product, $[CH_2O][OH^-]^{0.5}$, is increased to raise the intrinsic anodic reaction rate less than the cathodic rate as the cathodic rate is increased.

The Ratio, $r_a/r_c$, may be maintained less than 1 while increasing both the anodic and cathodic reactions rates, by increasing the rate of the intrinsic anodic reaction less than an increase in the rate of the cathodic reaction. The rate of the intrinsic anodic reaction may be increased by (1) decreasing the concentration of the reducing agent (i.e., lower formaldehyde) while increasing the pH; or (2) increasing the pH in the presence of anodic depolarizers such as heterocyclic aromatic nitrogen or sulfur compounds.

For plating solutions operating above room temperature, the square root of the hydroxide ion concentration $[OH^-]^{0.5}$ may be conveniently estimated using the room temperature (25° C.) pH of the solutions. In the examples below, values are given for the expression $[CH_2O][OH^-]^{0.5}$ using the pH of the respective solutions at room temperature. To illustrate the validity of this simplification in the table below values calculated with room temperature pH are compared with the values calculated from the pH at operating temperature (75° C.) for first seven examples.

| Example | CH$_2$O mol/l | pH 25° C. | $[CH_2O][OH^-]^{0.5}$ 25° C. | $[CH_2O][OH^-]^{0.5}$ 75° C. |
|---|---|---|---|---|
| 1 | 0.07 | 11.8 | 0.0058 | 0.0062 |
| 1 | 0.02 | 11.5 | 0.001 | 0.0013 |
| 2 | 0.07 | 11.7 | 0.0047 | 0.0055 |
| 2 | 0.03 | 11.5 | 0.0016 | 0.0020 |
| 3 | 0.05 | 11.55 | 0.003 | 0.0033 |
| 4 | 0.08 | 11.9 | 0.007 | 0.008 |
| 5 | 0.067 | 11.7 | 0.0047 | 0.0053 |
| 6A | 0.049 | 11.6 | 0.0031 | 0.0035 |
| 6B | 0.048 | 11.75 | 0.0036 | 0.0040 |
| 7A | 0.133 | 12.8 | 0.0333 | 0.0333 |
| 7B | 0.067 | 12.6 | 0.0133 | 0.0134 |

In the event, that bath contaminants cause reduction of deposition rate and inadequate copper quality because of temporary, localized passivation of the plating surface, the condition must be compensated for by increasing the plating current produced by the anodic half-reaction, i.e., by increasing pH. Since this will increase intrinsic anodic reaction rate, the copper concentration must be increased to bring the Ratio of $r_a/r_c$ to the original value before the solution became contaminated, or a value below 1.1 and adequate for the resulting plating rate.

Measurement of the Intrinsic Rate of the Partial Reactions

We have determined ratio of the intrinsic rate of the partial anodic and cathodic reactions from measurements of current-potential relationships in a narrow potential range (e.g., from −30 to +30 mV from the mixed potential, $E_{mp}$). This relationship is used in two ways. Both methods give similar conclusions regarding conditions for producing copper of preferred qualities.

In one method, the cathodic current, $i_c$, at the potential which is 10 mV negative with respect to the $E_{mp}$ (i.e., the over potential, Eta= −10 mV vs. $E_{mp}$) is taken as the rate of the cathodic partial reaction, $(r_c)_{-10mV}$, or simplified $r_c$; the anodic current $i_a$ at the potential which is 10 mV positive with respect to the mixed potential, $E_{mp}$, (i.e. the overpotential, Eta= +10 mV vs. $E_{mp}$) is taken as the rate of the anodic partial reaction, $(r_a)_{+10mV}$, or simplified $r_a$.

Alternatively, in a computerized method, the intrinsic rates of the partial reactions are determined using the rate expression $$r' = \sum_{j=1}^{n} [i_j E_j] / \sum_{j=1}^{n} [(E_j)^2]$$

where r' is the partial rate, $i_j$ is the current density at an overpotential, $\eta_j$ (Eta), referenced to the mixed potential, $E_{mp}$, and $E_j$ is calculated from the overpotential vs. $E_{mp}$, $\eta_j$ (Eta), according to the equation $$E_j = 10^{(\eta_j/b_a)} - 10^{(-\eta_j/b_c)}$$

where $b_a$ and $b_c$ are the Tafel slopes. For an electrochemical reaction, a plot of the overpotential, $\eta$, from the thermodynamic equilibrium potential vs. logarithim of the current, log i, was found by Tafel to be of the form $$\eta = a - b(\log i).$$

For many electroless solutions, the anodic reaction, $$CH_2O + 2OH^- = HCOO^- + H_2O + \tfrac{1}{2}H_2 + e^-$$

the constant $b_a$ has the value 940 mV/decade, and for the cathodic reaction,

$b_c$ has the value 310 mV/decade.

The rate of the cathodic partial reaction, $r_c'$, is obtained, in this invention, by applying the above equation to a set of pairs of experimental values $(i_j, E_j)$ from the cathodic potential range which is, e.g. from −30 mV vs. $E_{mp}$ to $E_{mp}$. The rate of the partial anodic reaction, $r_a'$, is obtained by applying the above equation to a set of pairs of experimental values obtained from the anodic potential range which is, e.g., from $E_{mp}$ to E= +30 mV vs. $E_{mp}$.

The currents used to calculate intrinsic reaction rates are measured at potentials near $E_{mp}$, e.g., 10–50 mV from $E_{mp}$, which may introduce some errors in the determination of the intrinsic reaction rates. The equations strictly apply only close to the mixed potential. If one examines both positive and negative overpotentials and currents for a particular solution, one will find near the mixed potential, the overpotential departs from the Tafel (semilogarithmic) relationship. The current measurements for determination of the intrinsic anodic and cathodic reaction rates must be in the range where the semi-logarithmic relationship is non-linear. This range is often within ±40 mV of the $E_{mp}$, but can be larger or smaller depending on the electroless plating solution formulation. The admissible error depends on the set point of the ratio of the intrinsic anodic and cathodic reaction rates and thus on the formulation of the electroless plating solution.

Procedure

An experimental setup for carrying out electrochemical measurements of $r_a$, $r_a'$, $r_c$ and $r_c'$, according to this invention, is shown in FIG. 1. The setup shown in FIG. 1 is composed of an electrochemical cell (110), a potentiostat with function generator (120) and a recorder (130).

In a typical test, an all-glass, single compartment cell with three electrodes was used. The test electrode was a platinum wire, 3.8 mm² in area (length 2.0 mm, diameter 0.6 mm), and the auxiliary electrode a platinum cylinder (about 10 mm² in area), both electroplated with copper. Plating was done in an acid copper solution ($CuSO_4 \cdot 5H_2O$ — 188 g/l, $H_2SO_4$ — 74 g/l) at 10 mA/cm² for 1–5 min. A saturated calomel electrode (SCE) was used as a reference electrode.

The current-potential curves were obtained with an IBM Instruments Inc. EC/225 Voltammetric Analyzer ™ (120 in FIG. 1) and recorded on an IBM Instruments Inc. 7424 X-Y-T Recorder ™ (130).

Figure 2:
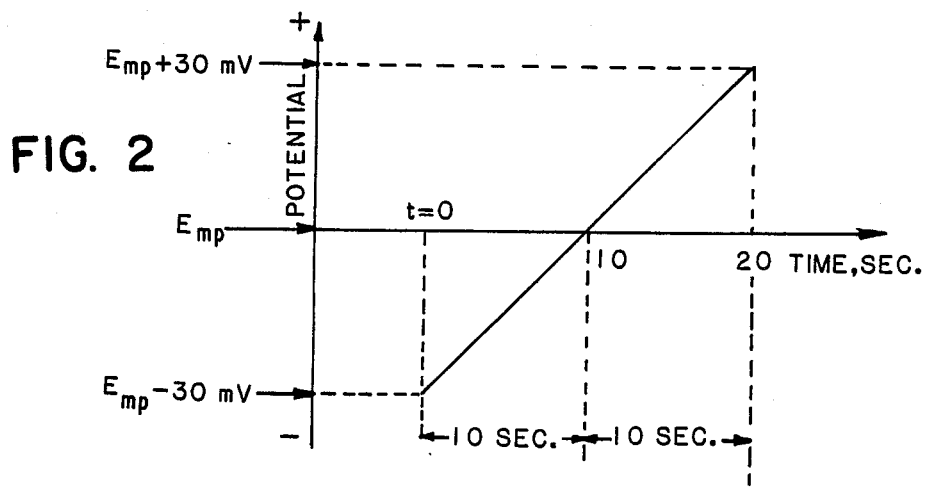
FIG. 2 is plot of the potential applied in making the measurements vs. time as described in Example 1.

The test electrode, (111) in FIG. 1, an auxiliary electrode, (112), and a reference electrode (113) are connected to the potentiostat, (120). The potentiostat with function generator was used in a DC operating mode, for linear sweep voltammetry (LSV). The sweep waveform as shown in FIG. 2 is a linear ramp; the current is continuously sampled; when the potential reaches a final value, it is left at this value for a short period of time and then reset to the initial value, or an automatic scan reversal to the initial value can be used.

EXAMPLE 1

Fully additive printed circuit boards were produced by electrolessly plating copper on adhesive coated, glass reinforced, epoxy laminates. Copper conductors deposited in the conductive pattern and on the walls of the plated through holes were 35 micrometers thick. The plating solution used had the following formulation:

| | |
|---|---|
| Copper Sulfate | 0.028 moles/l |
| Ethylenedinitrilotetraacetic Acid (EDTA) | 0.079 moles/l |
| Sodium Sulfate for (adjusting Spec. Gravity) | 0.50 moles/l |
| Formaldehyde | 0.07 moles/l |
| pH (at 25° C.) | 11.8 |
| $[CH_2O][OH^-]^{0.5}$ | 0.006 (moles/l)$^{1.5}$ |
| Surfactant (Nonylphenylpolyethoxyphosphate, Gafac RE-610 ™, GAF Corp.) | 0.04 g/l |
| Sodium Cyanide (by specific ion electrode No. 94-06 ™ from Orion Research, Inc., Cambridge, MA 02138) | −150 mV vs SCE |
| Specific Gravity (at 25° C.) | 1.082 |
| Operating temperature | 75° C. |

The printed wiring boards plated in this solution were tested for thermal stress resistance according to MIL P-55110-D at 288° C. for 10 seconds using molten solder. After the test, cracks were found between the copper surface conductors and the copper hole walls.

Figure 3:
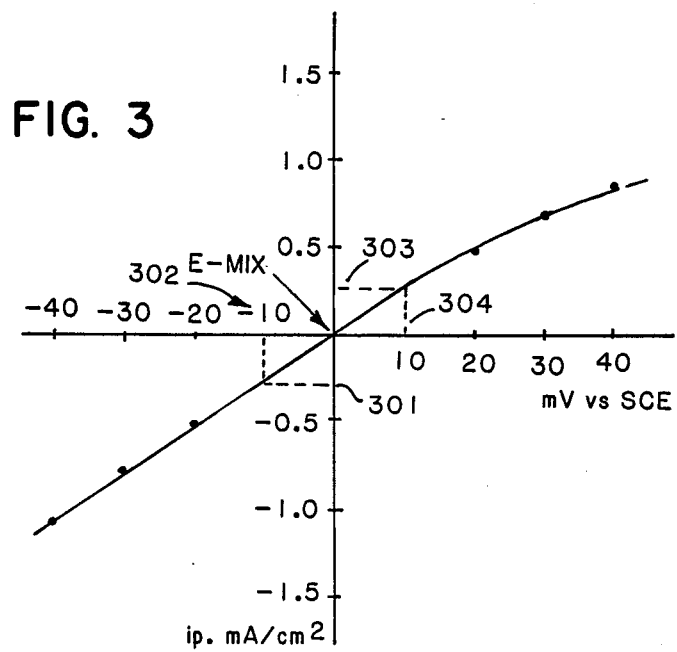
FIG. 3 is the plot of the current produced vs. the potential applied as described in Example 1.

The electroless copper plating solution was tested to determine the polarization data in the vicinity of +40 mV to −40 mV with reference to mixed potential, $E_{mp}$. FIG. 2 shows the potential ramp of the test electrode vs. the reference electrode from −40 mV as a function of time. FIG. 3 shows a current-potential graph of this test. As the applied potential on the test electrode is increased from −40 mV (with reference to the $E_{mp}$) to 0 (at $E_{mp}$), the auxiliary electrode (112) was anodic with respect to the test electrode (111) and a cathodic current was recorded on the test electrode. As the applied voltage approached $E_{mp}$, the current dropped to zero. As the applied potential became positive, the auxiliary electrode became cathodic with respect to the test electrode, and the anodic current on the test electrode starting from zero at $E_{mp}$ increased.

For electrolessly depositing fissure resistant copper according to this invention, the plating reaction must be under anodic control. That means intrinsic anodic reaction rate is no more than 10% greater than, and preferably less than, the intrinsic cathodic reaction rate, or the ratio of the intrinsic anodic reaction rate to the intrinsic cathodic reaction rate is less than 1.1.

In a first test of the criterion of anodic control, the ratio of the anodic current at 10 mV above $E_{mp}$ and the cathodic current at 10 mV below $E_{mp}$ was taken as an approximation of the ratio of the intrinsic anodic and cathodic reaction rates. Referring to FIG. 3, at the potential, 302, which is 10 mV negative with respect to $E_{mp}$, the cathodic current, $i_c$, 301, was taken as the rate of the cathodic partial reaction, $r_c$. At the potential, 304, which is 10 mV positive with respect to $E_{mp}$ the anodic current, $i_a$, 303, was taken as the rate of the anodic partial reaction, $r_a$. Since the copper deposited by an electroless plating reaction is equivalent to a deposition current of 1–3 mA/cm², the current, $r_c$, is actually the change in the deposition current produced by an overpotential of −10 mV, and $r_a$ is the change due to an overpotential of +10 mV. The measured values of $r_a$ at +10 mV vs. $E_{mp}$ and $r_c$ at −10 mV vs. $E_{mp}$ were:

$r_a = 0.40$ mA/cm²; $r_c = 0.37$ mA/cm²

Therefore:

Ratio = $r_a/r_c = 0.40/0.37 = 1.08$

The Ratio was greater than 1.05, but less than 1.10, by this test. In order to confirm the relationship of the Ratio to the tendency of the copper deposits to form cracks in the holes in the 288° C. thermal stress test, a second, more precise analysis was performed on the electrochemical data.

In the second more precise method, the rate of the partial reactions was determined using the rate expression:

$$r' = \sum_{j=1}^{n} E_j i_j / \sum_{j=1}^{n} [(E_j)^2]$$

where r' is the rate in milliamperes/square millimeter, $E_j = 10^{(\eta_j b_a)} - 10^{(-\eta_j/b_c)}$ and
$b_a$ was 940 mV/decade and $b_c$ was 310 mV/decade.

The anodic rate, $r'_a$, and the cathodic rate, $r'_c$, were calculated using the above equation in the region of −40 mV to +40 mV with respect to $E_{mp}$.

The data from the electrochemical measurement was:

| Overpotential mV | Current i, mA/cm² |
|---|---|
| 10 | 0.40 |
| 20 | 0.72 |
| 30 | 1.01 |
| 40 | 1.28 |
| −10 | −0.37 |
| −20 | −0.72 |
| −30 | −1.03 |
| −40 | −1.36 |
| $(E_j i_j)_a = 1.115$ | $(E_j)_a^2 = 0.349$ |
| $(E_j i_j)_c = 0.913$ | $(E_j)_c^2 = 0.25$ |
| $r_a' = 3.65$ mA/cm² | $r_c' = 3.19$ mA/cm² |
| Ratio' = 3.65/3.19 = 1.14 | |

This precise calculation of the Ratio' showed that the copper deposited was from a solution with a Ratio' greater than 1.10 and therefore not under anodic control. Such copper would fail the thermal stress test.

The formulation of the plating solution was modified according to the principles of this invention in order to produce a copper plating solution operating under anodic control and a copper deposit which would pass the thermal stress test.

The concentration of the anodic reactant, the reducing agent, was lowered by lowering the product $[HCHO][OH^-]^{0.5}$. The formaldehyde concentration was reduced by almost 60% reducing the mole ratio of formaldehyde to copper from 2.5 to 0.7. The pH, and thus the hydroxide concentration, also was decreased. The additive, sodium cyanide, concentration was reduced by over 85% (50 mV as measured by the specific ion electrode.) The revised formulation was:

| | |
|---|---|
| Copper Sulfate | 0.028 moles/l |
| EDTA | 0.079 moles/l |
| Sodium Sulfate | 0.61 moles/l |
| Formaldehyde | 0.02 moles/l |
| pH (at 25° C.) | 11.5 |
| $[CH_2O][OH^-]^{0.5}$ | 0.001 (m/l)$^{1.5}$ |
| Surfactant | 0.04 g/l |
| Sodium Cyanide (by specific ion electrode, Orion No 94-06) | −100 mV vs. SCE |
| Specific Gravity (at 25° C.) | 1.098 |
| Temperature | 75° C. |

The modified formulation reduced the Ratio, $r_a/r_c$, below 1, and provided copper deposits that passed the thermal stress test. The electrochemical analysis of the intrinsic anodic and cathodic reaction rates was performed as described above. The results were:

$r_a = 0.27$ mA/cm²; $r_c = 0.28$ mA/cm²

Ratio = $r_a/r_c = 0.96$; and $r'_a = 2.44$ mA/cm²; $r'_c = 2.46$ mA/cm²

Ratio' = $r'_a/r'_c = 0.99$.

These electrochemical tests also showed that copper deposited from the revised formulation would pass the thermal shock test.

Fully additive printed wiring boards were plated in the electroless copper solution, and after testing with molten solder at 288° C. for 10 seconds there were no cracks in the walls of the plated-through holes or at the junction between the walls of the plated through holes and the surface conductive patterns.

In this example additive printed circuit boards were prepared using an electroless copper plating solution which failed one and was marginal on one, of the test methods taught by this invention. These additive printed circuit boards failed the thermal stress test of 10 seconds exposure to molten solder at 288° C. The plating solution was found to have a ratio $r'_a/r'_c$ greater than 1.1. When the solution was modified so that the ratio $r'_a/r'_c$ was less than 1 according to the teachings of this invention, it produced additive printed circuit boards that passed the thermal stress test.

EXAMPLE 2

An electroless copper plating solution was formulated as in Example 1, except that instead of adjusting the specific gravity by putting sodium sulfate in the formulation to simulate the high specific gravity of a continuous operating solution, the plating reaction was run for about 10 turnovers to develop the specific gravity of a normal production bath. A turnover is defined as one replacement of the copper ion content of the plating solution, i.e., for 10 turnovers of a plating solution containing 0.028 moles of copper ion/liter, 0.28 moles/l or 18 grams/l, of copper metal is plated out; and 0.28 moles/l of copper salt and the required amounts of formaldehyde and sodium hydroxide have been added to the solution to maintain the solution. The high specific gravity of the solution is due to the reaction by-products, sodium sulfate and sodium formate. The formulation was as follows:

| | |
|---|---|
| Copper Sulfate | 0.028 moles/l |
| EDTA | 0.079 moles/l |
| Formaldehyde | 0.07 moles/l |
| Maintain surface tension (Gafac RE-610) | 45 dynes/cm$^2$ |
| Sodium Cyanide (Orion No. 94-06 electrode) | −135 mV vs. SCE (at 25) |
| pH (at 25° C.) | 11.7 |
| [CH$_2$O][OH$^-$]$^{0.5}$ | 0.005 (moles/l)$^{1.5}$ |
| Specific Gravity (at 25° C.) | 1.090 |
| Temperature | 75° C. |

Fully additive printed wiring boards plated in this solution exhibited a few cracked hole walls after the thermal stress test. Electrochemical analysis of this bath yielded the data as shown below:

$$r_a = 0.30 \text{ mA/cm}^2; r_a = 0.28 \text{ mA/cm}^2$$
$$\text{Ratio} = 0.30/0.28 = 1.07$$
$$r'_a = 2.92 \text{ mA/cm}^2; r'_c = 2.54 \text{ mA/cm}^2$$
$$\text{Ratio}' = 2.92/2.54 = 1.15.$$

As had been expected, the Ratio', since it was greater than 1.1, indicated this solution would produce printed wiring boards that would fail the thermal stress test. The less precise Ratio, since it was greater than 1.05, suggested the copper deposits might not be strong enough to pass the thermal stress test.

In order to improve the resistance to fissures of the deposited copper and to provide copper plated printed wiring boards that would pass the thermal stress test, the formulation was modified. The anodic reaction rate was lowered by decreasing the formaldehyde from 0.07 to 0.03 moles/l, which lowered the ratio of the mole concentration of formaldehyde to the mole concentration of copper from 2.8 to 1.1. The pH was lowered from 11.7 to 11.5 so that the product, [HCHO]-[OH$^-$]$^{0.5}$, was dropped from 0.0054 to 0.0017. To maintain plating at lower reducing agent concentration, the stabilizer additive, sodium cyanide, was reduced to a concentration equivalent to −100 mV vs. SCE at 25° C. Electrochemical analysis was performed as described in Example 1 with the following results:

$$r_a = 0.13 \text{ mA/cm}^2; r_c = 0.17 \text{ mA/cm}^2$$
$$\text{Ratio} = 0.13/0.17 = 0.76$$
$$r'_a = 1.36 \text{ mA/cm}^2; r'_c = 1.86 \text{ mA/cm}^2$$
$$\text{Ratio}' = 1.36/1.86 = 0.73.$$

As predicted by the Ratio tests (i.e., Ratios less than 1) printed wiring boards plated with copper in the modified solution passed the thermal stress tests.

EXAMPLE 3

An electroless copper plating bath was prepared with a stabilizer system using both vanadium and cyanide addition agents. The copper content of the solution was turned over until specific gravity reached 1.09. The formulation was as follows:

| | |
|---|---|
| Copper Sulfate | 0.028 moles/l |
| EDTA | 0.075 moles/l |
| Formaldehyde | 0.050 moles/l |
| pH | 11.55 |
| [HCHO][OH$^-$]$^{0.5}$ | 0.0030 (moles/l)$^{1.5}$ |
| Surfactant (Gafac RE-610) | 0.04 grams/l |
| Vanadium Pentoxide | 0.0015 grams/l |
| Sodium Cyanide (Orion electrode) | −105 mV vs. SCE |
| Specific Gravity (at 25° C.) | 1.090 |
| Temperature | 75° C. |

Electrochemical analysis of the solution as described in Example 1 gave the following results:

$$r_a = 0.26 \text{ mA/cm}^2; r_c = 0.33 \text{ mA/cm}^2$$
$$\text{Ratio} = 0.79$$
$$r'_a = 2.56 \text{ mA/cm}^2; r'_c = 2.80 \text{ mA/cm}^2$$
$$\text{Ratio}' = 0.89$$

This solution was used to electrolessly deposit copper on 1.5 mm thick, adhesive coated, epoxy-glass laminates to make fully additive printed wiring boards. The printed wiring boards passed the Mil P-55110-D thermal stress test of 288° C. for 10 seconds.

The results from the thermal stress test confirm the electrochemical tests. Both the thermal stress and the electrochemical analysis indicate a high quality, tough, copper deposit.

EXAMPLE 4

An electroless copper plating solution was prepared with a high copper concentration and a correspondingly high specific gravity. The ratio of the mole concentration of the formaldehyde reducing agent to the mole concentration of the copper was 0.67. The formulation was as follows:

| | |
|---|---|
| Copper sulfate | 0.12 moles/l |
| Ethylenedinitrilotetraacetic acid | 0.20 moles/l |
| Formaldehyde | 0.08 moles/l |
| pH (25° C.) | 11.9 |
| $[CH_2O][OH^-]^{0.5}$ | 0.007 $(moles/l)^{1.5}$ |
| Cyanide (Orion electrode) | 110 mV vs. SCE |
| Vanadium pentoxide | 5 mg/l |
| Specific gravity | 1.124 |
| Operating Temperature | 75° C. |
| $r_a$ | 0.14 mA/cm$^2$ |
| $r_c$ | 0.16 mA/cm$^2$ |
| Ratio ($r_a/r_c$) | 0.88 |
| $r_a'$ | 1.13 mA/cm$^2$ |
| $r_c'$ | 1.96 mA/cm$^2$ |
| Ratio' ($r_a'/r_c'$) | 0.58 |

Additive printed circuit boards were plated in this solution and after plating, tested by the thermal stress test at 288° C. for 10 seconds. There were no cracks formed in the copper by the thermal stress test which confirmed the results from the ratio of the intrinsic anodic and cathodic reaction rates.

EXAMPLE 5

A vanadium stabilizer system was tested in a solution taken from a working, production electroless copper plating solution. This solution contained the by-product sodium formate and sodium sulfate produced by the copper turnovers as the solution was used. The formulation was as follows:

| | |
|---|---|
| Copper Sulfate | 0.028 moles/l |
| EDTA | 0.076 moles/l |
| Formaldehyde | 0.067 moles/l |
| pH (25° C.) | 11.7 |
| $[CH_2O][OH^-]^{0.5}$ | 0.0054 $(moles/l)^{1.5}$ |
| Surfactant (Gafac RE-610) | 0.04 grams/l |
| Vanadium pentoxide | 0.003 grams/l |
| Specific Gravity (at 25° C.) | 1.082 |
| Temperature | 75° C. |

Fully additive printed wiring boards were plated in this solution to a copper thickness of 35 micrometers. The printed wiring boards were subjected to the Mil P-55110D thermal stress test. Over 60% of the plated-through holes developed breaks separating the copper hole walls from the copper surface conductors in the thermal stress test.

Electrochemical analysis was performed as described in Example 1 yielding the kinetic data shown below:

$r_a$ = 0.34 mA/cm$^2$; $r_c$ = 0.31 mA/cm$^2$

Ratio = 0.34/0.31 = 1.1

Since the Ratio was greater than one, the holes were expected to crack. The more precise Ratio' test had the following results:

$r'_a$ = 4.01 mA/cm$^2$; $r'_c$ = 2.65 mA/cm$^2$

Ratio' = 4.01/2.65 = 1.5

Since this Ratio' test gave a result very much greater than 1, the high percentage of failures in the thermal stress test was to be expected in the light of the teaching of this invention.

EXAMPLE 6

A solution from another working, production, electroless copper, plating bath was adjusted to the formulation of Example 3 as far as its formulated bath constituents are concerned. The formulation was the same as the successful Example 3 solution, however the ratio of formaldehyde to copper was greater than 1.2 so the solution would not consistently deposit high quality copper as the by-products and contaminants built up and the Ratio changed. Electrochemical analysis of the solution gave a Ratio of 1.1 and a Ratio' of 1.05, indicating borderline performance. The deviation of the electrochemical Ratio results from the good Ratio results obtained in Example 3 indicate the presence of an unknown contaminate. Fully additive printed wiring boards were prepared on adhesive coated, epoxy-glass laminates in this electroless copper plating bath. Thermal stress testing showed cracks in 20% of the copper hole walls. The solution was modified by reducing the vanadium stabilizer and increasing the pH in order to get electrochemical ratios less than 1. The formulations of these two solutions are shown below.

| | | A | B |
|---|---|---|---|
| Copper Sulfate | moles/l | 0.028 | 0.028 |
| EDTA | moles/l | 0.076 | 0.076 |
| Formaldehyde | moles/l | 0.049 | 0.048 |
| pH (at 25° C.) | | 11.6 | 11.75 |
| $[HCHO][OH^-]^{0.5}$ | $(moles/l)^{1.5}$ | 0.0031 | 0.0036 |
| Sodium Cyanide (Orion electrode) | mV vs. SCE | −110 | −110 |
| Vanadium Pentoxide | grams/l | 0.0012 | 0.0008 |
| Specific Gravity (at 25° C.) | grams/ml | 1.094 | 1.094 |
| Temperature | °C. | 75 | 75 |
| $r_a$ | mA/cm$^2$ | 0.33 | 0.30 |
| $r_c$ | mA/cm$^2$ | 0.30 | 0.33 |
| Ratio | | 1.10 | 0.91 |
| $r_a'$ | mA/cm$^2$ | 2.87 | 2.75 |
| $r_c'$ | mA/cm$^2$ | 2.74 | 2.93 |
| Ratio' | | 1.05 | 0.94 |
| Thermal Stress | cracks | 20% | 0% |

This example demonstrates the utility of the Ratio of the electrochemical analysis of the intrinsic anodic and cathodic reaction rates to adjust an operating plating solution and compensate for contamination.

EXAMPLE 7

In order to deposit copper that would pass the thermal stress test, a solution was prepared similar to Example 6, with a pH of 11.9 and a ratio of formaldehyde to copper of 0.84. The solution had the following formulation:

| | |
|---|---|
| Copper sulfate | 0.056 moles/l |
| EDTA | 0.110 moles/l |
| Formaldehyde | 0.047 moles/l |
| pH (at 25° C.) | 11.9 |
| $[CH_2O][OH^-]^{0.5}$ | 0.0042 $(moles/l)^{1.5}$ |
| Sodium Cyanide (by Orion electrode) | −100 mV vs SCE |
| Vanadium Pentoxide | 0.004 grams/l |
| Specific Gravity | 1.066 (at 25° C.) |
| Temperature | 75° C. |
| $r_a$ | 0.33 mA/cm$^2$ |
| $r_c$ | 0.40 mA/cm$^2$ |
| Ratio | 0.83 |
| $r_a'$ | 1.69 mA/cm$^2$ |
| $r_c'$ | 1.98 mA/cm$^2$ |
| Ratio' | 0.85 |

| | | |
|---|---|---|
| -continued | | |
| Thermal Stress | no cracks | |

Because the solution was under anodic control, the increase in the copper ion concentration to twice the concentration of Example 6 did not cause a corresponding increase in the plating rate. The copper metal was deposited at approximately the same rate as the solutions of Example 6, and it required 17 hours to deposit copper 35 micrometers thick.

In order to accelerate the plating rate, since the concentration of the cathodic reactant had already been doubled over Example 6, the concentration of the anodic reactants were increased. The changes in the formulation are shown below:

| | |
|---|---|
| pH (at 25° C.) | 12.2 |
| $[CH_2O][OH^-]^{0.5}$ | 0.006 (moles/l)$^{1.5}$ |
| Sodium Cyanide | −110 mV vs SCE |
| Specific Gravity | 1.070 (at 25° C.) |
| $r_a$ | 0.47 mA/cm$^2$ |
| $r_c$ | 0.49 mA/cm$^2$ |
| Ratio | 0.96 |
| $r_a'$ | 5.02 mA/cm$^2$ |
| $r_c'$ | 5.30 mA/cm$^2$ |
| Ratio' | 0.95 |
| Thermal Stress | no cracks |

This solution deposited copper 35 micrometers thick in less than 8 hours. This examples illustrates how the principles of this invention may be used to obtain copper with superior physical properties at fast plating rates.

EXAMPLE 8

An electroless copper plating solution was formulated using a polyethylene glycol and 2,2,-dipyridyl as the stabilizer. The modified formulation was:

| | | |
|---|---|---|
| Copper sulfate pentahydrate | g/l | 12 |
| Ethylenedinitrilotetraacetic acid | g/l | 32 |
| Formaldehyde 37% solution | g/l | 3.2 |
| pH | (25° C.) | 12.0 |
| Polyethylene glycol (M.W. = 600) | g/l | 10 |
| 2,2'-dipyridyl | mg/l | 30 |
| Operating temperature | °C. | 75 |

Electrochemical analysis of the intrinsic anodic and cathodic reaction rates of this solution by the methods described in Example 1 yielded the following results:

$$r_a = 0.28 \text{ mA/cm}^2; r_c = 0.30 \text{ mA/cm}^2$$
$$\text{Ratio} = 0.28/0.30 = 0.93$$

and $$r'_a = 2.97 \text{ mA/cm}^2; r'_c = 3.18 \text{ mA/cm}^2$$
$$\text{Ratio'} = 2.97/3.18 = 0.93$$

Since the results of both the electrochemical ratio tests are less than one, the tests indicate the copper deposited by this solution would pass the 288° C. thermal stress test.

These test results were confirmed by electrolessly plating a printed wiring pattern on an epoxy-glass laminate in the solution. After plating the laminate was heat treated by the standard procedure, 1 hour at 160° C., and thermal stress tested at 288° C. No cracks were formed in the copper conductors or the plated through holes.

EXAMPLE 9

In another formulation a different polyethylene glycol was used as a stabilizer along with 2,2'-dipyridyl and sodium cyanide.

The modified formulation was as follows:

| | | |
|---|---|---|
| Copper sulfate pentahydrate | g/l | 10 |
| Ethylenedinitrilotetraacetic acid | g/l | 45 |
| Formaldehyde (37% solution) | ml/l | 4 |
| Polyethylene glycol (M.W. = 1900) | g/l | 20 |
| 2,2'-dipyridyl | mg/l | 30 |
| Sodium cyanide | mg/l | 1 |
| pH (measured at 25° C.) | | 12.4 |
| $[CH_2O][OH^-]^{0.5}$ | | 0.008 |
| Operating temperature | °C. | 75 |

Anodic and cathodic electrochemical analyses were performed on the solution by the methods described in Example 1. The data from the electrochemical tests yielded the following results:

$$r_a = 0.15 \text{ mA/cm}^2; r_c = 0.16 \text{ mA/cm}^2$$
$$\text{Ratio} = 0.15/0.16 = 0.94$$

and $$r'_a = 1.66 \text{ mA/cm}^2; r'_c = 1.72 \text{ mA/cm}^2$$
$$\text{Ratio'} = 1.66/1.72 = 0.97$$

This data indicated the copper deposited from the solution would be fissure free. Printed wiring boards plated in the solution were thermally stressed by floating the boards on molten solder at 288° C. for 10 seconds. No cracks or fissures developed in the copper conductor tracks or plated through holes.

EXAMPLE 10

In this example a test solution was deliberately contaminated to show how the teaching of this invention may be used to adjust the formulation, or reset the control parameters, to obtain fissure free copper deposits from a solution in which contaminants have built up over a period of time as the solution is used.

The electroless copper test solution was similar to the solution of Example 3. In the table below this solution is marked A. The electrochemical analysis of the solution gave a ratio of the intrinsic anodic reaction rate to the intrinsic cathodic reaction rate, Ratio'=$r'_a$/$r'_c$, of less than 1.1 indicating the solution would deposit fissure free copper.

As a deliberate contaminant, 1 mg/l of 2-mercaptobenzothiazole (2-MBT), was added to the test solution. The addition of the contaminant turned the solution passive, i.e. stopped the electroless plating reaction, and the mixed potential of the copper electrode in the test solution was shifted outside the electroless plating range. In the table below, this is solution B. The electrochemical analysis showed the Ratio' at this new mixed potential was greater than 1.1.

The conventional practice in the prior art was to increase the formaldehyde in order to regain a mixed potential for electroless copper plating. Following the conventional procedure the formaldehyde concentration was tripled. Even at this higher formaldehyde concentration the solution was almost passive, depositing copper at an extremely slow rate, less than 0.04 micrometers per hour. The solution is listed in the table as solution C. The ratio of the intrinsic anodic reaction rate to the intrinsic cathodic reaction rate, Ratio, was greater than 1.1, indicating that even if a solution at such a slow plating rate would deposit copper 25 micrometers thick, the deposit would fissure and fail a thermal stress test.

To increase the rate of copper deposition, the test solution was further modified by increasing the pH by one pH unit. The modified formulation is listed in the table as solution D. While the rate of deposition was increased, as expected the electro-chemical analysis of the intrinsic anodic and cathodic reaction rates gave a Ratio' greater than 1.1 indicating the copper deposits would be subject to fissures.

Following the teaching of this invention, the copper concentration of the formulation was increased to increase the intrinsic cathodic reaction rate relative to the intrinsic anodic reaction rate. However, this solution, listed in the table as E, still had a Ratio' of the intrinsic anodic reaction rate to the intrinsic cathodic reaction rate greater than 1.1.

To lower the intrinsic anodic reaction rate relative to the intrinsic cathodic reaction rate the solution was reformulated with a ratio of formaldehyde concentration to the copper concentration of 0.7; this is solution F. The Ratio' was reduced to less than 1.1, so the solution would deposit copper resistant to fissures.

To achieve a more preferred Ratio' of the intrinsic anodic reaction rate to the intrinsic cathodic reaction rate, the concentration of the anodic reactant, formaldehyde, was further reduced. The formulation is listed as solution G. The Ratio' of the intrinsic anodic reaction rate to the intrinsic cathodic reaction for this solution is less than 1.0, and thus the solution can provide a high quality, fissure free copper deposits.

This example shows that with mercaptobenzothiazole as an accelerator or depolarizing agent increased copper concentration and pH with the same or decreased formaldehyde concentration leads to faster plating rates and high quality copper deposits. The plating rate of solution A without the accelerator or depolarizing agent, was 1.4 micrometers per hour. The plating rates of solutions C and D with the accelerator or depolarizing agent were 4.0 and 3.3 micrometers per hour respectively.

bath controller which continuously measured the solution parameters such as the copper and formaldehyde concentrations, the pH, the cyanide ion activity and the temperature. The plating bath controller automatically compared the measured parameters to the set points and made additions to the solution to maintain the solution within the preset operating limits.

The plating solution was prepared similar to that of Example 3. The solution was operated to deposit approximately 6 turnovers. (A turnover is replacing the copper salt content of the solution once). This raised the specific gravity of the solution due to the formation of by-product sodium sulfate and sodium formate. The intrinsic anodic and cathodic reaction rates were measured by electrochemical analysis, and the Ratio' of the intrinsic anodic reaction rate to the intrinsic cathodic reaction rate was less than 1.1, which indicates the copper deposit is resistant to fissures. The solution was used to make additive printed circuits by the electroless deposition of copper to form surface conductors and plated through holes. The printed circuits were thermally stressed by contact with molten solder at 288° C. for 10 seconds. After thermal stress the plated through holes were microsectioned and examined for cracks in the deposited copper. There was no evidence of cracks or fissures in the copper conductors or plated through holes. The formulation tested is shown in the table below.

The operating solution, found to deposit fissure free copper, was then treated with 0.5 mg of 2-mercaptobenzothiazole (2-MBT) as a deliberate contaminant to simulate the effect of contamination of the plating solution by organic compounds. Organic contamination is a frequent problem in electroless copper plating, especially in solutions operated for five or more turnovers. Sources of contamination include leaching from plastic substrates being electrolessly plated, from the plating resist or from fortuitous contamination.

After the addition of the contaminant, the plating solution became substantially passive. The plating rate was about 0.03 micrometers of copper per hour and the solution would no longer deposit copper on the hole walls of the insulating base material to make plated through holes. The Ratio' of the intrinsic anodic and cathodic reaction rates was greater than 1.1, so even if copper would have deposited on the hole walls, the formed deposit, and thus the plated through holes, would fail the thermal stress test. This solution is more

| Solution | | A | B | C | D | E | F | G |
|---|---|---|---|---|---|---|---|---|
| $CuSO_4$ | mol/l | 0.028 | 0.028 | 0.028 | 0.028 | 0.056 | 0.056 | 0.056 |
| EDTA | mol/l | 0.101 | 0.101 | 0.101 | 0.101 | 0.157 | 0.157 | 0.157 |
| $CH_2O$ | mol/l | 0.04 | 0.04 | 0.133 | 0.133 | 0.133 | 0.04 | 0.027 |
| pH | 25° C. | 11.50 | 11.50 | 11.50 | 12.50 | 12.50 | 12.50 | 12.50 |
| Gafac RE610 | mg/l | 40 | 40 | 40 | 40 | 40 | 40 | 40 |
| $V_2O_5$ | mg/l | 1 | 1 | 1 | 1 | 1 | 1 | 1 |
| NaCN | mg/l | 20 | 20 | 20 | 20 | 20 | 20 | 20 |
| 2-MBT | mg/l | 0 | 1 | 1 | 1 | 1 | 1 | 1 |
| Temperature | °C. | 75 | 75 | 75 | 75 | 75 | 75 | 75 |
| Emix vs. SCE | mV | −749 | −406 | −490 | −820 | −845 | −810 | −786 |
| $r'_a$ | mA/cm$^2$ | 1.41 | 0.027 | 0.036 | 3.25 | 5.12 | 3.50 | 2.65 |
| $r'_c$ | mA/cm$^2$ | 1.49 | 0.019 | 0.028 | 2.90 | 4.46 | 3.32 | 2.79 |
| Ratio' | | 0.9 | 1.5 | 1.29 | 1.12 | 1.15 | 1.05 | 0.95 |
| Plating Rate | μm/hr | 1.7 | 0.02 | 0.03 | 3.6 | 5.6 | 4.0 | 3.3 |

EXAMPLE 11

The procedure of Example 10 was repeated using a plating tank for 70 liters of the solution. The plating tank was equipped with an electroless copper plating fully described below.

Following the procedures of Example 10, in a sample of the solution, the pH was raised to provide a more active plating solution, and the copper concentration was increased to adjust the Ratio' of the intrinsic anodic and cathodic reaction rates to less than 1.1. The increase in the copper concentration reduced the ratio of formaldehyde to copper from 1.7 to 0.85. When the Ratio' of less than 1.1 was achieved with the sample solution, the set points on the electroless plating bath controller for copper concentration and pH were reset. Additive printed circuit boards were plated in the contaminated electroless plating solution using the new set points. The copper deposited on these printed circuit boards was tested by thermal stress with molten solder at 288° C. for ten seconds and was found free of cracks or fissures.

The formulation, set points and test data for this solution are also given below.

|  |  | Original Good Solution | Bad Contaminated Solution | Solution with Reset Controls |
|---|---|---|---|---|
| CuSO4 | mol/l | 0.028 | 0.028 | 0.040 |
| EDTA | mol/l | 0.087 | 0.087 | 0.100 |
| CH2O | mol/l | 0.047 | 0.047 | 0.047 |
| pH | 25° C. | 11.75 | 11.75 | 12.40 |
| $[CH_2O][OH^-]^{0.5}$ | $(moles/l)^{1.5}$ | 0.0035 | 0.0035 | 0.0074 |
| Gafac RE-610 | mg/l | 40 | 40 | 40 |
| NaCN (Orion electrode vs. SCE) | mV | −130 | −130 | −130 |
| V2O5 | mg/l | 1 | 1 | 1 |
| Specific gravity | g/cm³ | 1.066 | 1.066 | 1.066 |
| Temperature | °C. | 75 | 75 | 75 |
| $E_{mp}$ vs. SCE | mV | −764 | −553 | −687 |
| Plating Rate | m/hr | 1.7 | 0.03 | 2.9 |
| $r_a'$ | mA/cm² | 1.44 | 0.028 | 2.57 |
| $r_c'$ | mA/cm² | 1.39 | 0.022 | 2.40 |
| Ratio' |  | 1.04 | 1.26 | 0.93 |
| Thermal stress |  | pass | — | pass |

In this example a passive, contaminated solution was restored to active plating, and then by adjustment of the formulation, according to the teachings of this invention, the intrinsic anodic and intrinsic cathodic reaction rates of the contaminated solution were adjusted to deposit high quality copper. The addition of 2-mrcaptobenzothiazole, a heterocylic nitrogen and sulfur compound, and increasing the copper concentration and pH resulted in a 70% increase in the plating rate.

EXAMPLE 12

In this example fissure resistant copper was deposited from an electroless copper deposition solution operating at low temperature. A first electroless copper plating solution was formulated to operate at 30° C. The formaldehyde concentration was higher than similar solutions at 75° C. as is the common practice in electroless copper solutions operating near room temperature. The ratio of the formaldehyde concentration to the copper concentration was 2.4. The solution plated slowly, depositing 25 micrometers of copper in three days. This first solution composition is given in the table below. As reported in the table, the ratio of the intrinsic anodic reaction rate to the intrinsic cathodic reaction rate is greater than 1.1, and the additive printed circuit boards prepared in the solution failed the thermal stress test.

Following the teachings of this invention, the concentration of the formaldehyde reducing agent was reduced to lower the anodic reaction rate relative to the cathodic reaction rate. The ratio of the formaldehyde concentration to the copper concentration was reduced to 0.5. The resulting solution is the 2nd solution in the table below.

|  |  | Solution 1st | Solution 2nd |
|---|---|---|---|
| CuSO4 | mol/l | 0.028 | 0.028 |
| EDTA | mol/l | 0.087 | 0.087 |
| Formaldehyde | mol/l | 0.067 | 0.013 |
| pH | 25° C. | 12.5 | 12.5 |
| $[CH_2O][OH^-]^{0.5}$ | $(moles/l)^{1.5}$ | 0.012 | 0.002 |
| NaCN | mg/l | 20 | 20 |
| V2O5 | mg/l | 3 | 3 |
| Temperature | °C. | 30 | 30 |
| $E_{mp}$ vs. SCE | mV | −783 | −750 |
| $r_a'$ | mA/cm² | 0.341 | 0.323 |
| $r_c$ | mA/cm² | 0.280 | 0.304 |
| Ratio' |  | 1.22 | 1.06 |

The second solution is used to plate additive printed circuit boards with copper 25 micrometers thick. It is difficult to initiate electroless plating on catalytic adhesive and catalytic base materials at low temperatures and low formaldehyde concentration. Therefore before plating the additive circuit boards the conductive pattern including the plated through holes is covered with a thin layer of copper about 0.2 micrometers thick in an electroless strike solution which has a formaldehyde concentration of 0.13 moles/liters.

These additive printed circuit boards pass the thermal stress test, demonstrating that maintaining a formaldehyde to copper ratio in an electroless plating solution less than 1.2 can provide fissure free copper deposits.

EXAMPLE 13

Two electroless copper plating solutions were prepared as shown below using tetrakis(2-hydroxypropyl)ethylenediamine as the complexing agent for the copper ion.

| Copper Sulfate | moles/l | 0.028 | 0.028 |
|---|---|---|---|
| tetakis(2-hydroxypropyl)-ethylenediamine | moles/l | 0.079 | 0.079 |
| Formaldehyde | moles/l | 0.027 | 0.027 |
| pH | 25° C. | 12.5 | 12.5 |
| $[CH_2O][OH^-]^{0.5}$ | $(moles/l)^{1.5}$ | 0.005 | 0.005 |
| Sodium cyanide | mg/l | 40 | 25 |
| Vanadium pentoxide | mg/l | 2 | — |
| 2,2'-dipyridyl | mg/l | — | 50 |
| Surfactant (Pluronic P-85 ™ BASF-Wyandotte Corp.) | mg/l | — | 10 |
| Operating Temperature | °C. | 61 | 50 |
| $E_{mp}$ vs. SCE | mV | −716 | −774 |
| $r_a'$ | mA/cm² | 2.84 | 2.38 |
| $r_c'$ | mA/cm² | 2.59 | 2.36 |
| Ratio' |  | 1.10 | 1.01 |
| Thermal stress cracks |  | yes | no |

When the ratio of intrinsic anodic to the intrinsic cathodic reaction rate was 1.1, the additive printed circuit boards produced in the electroless copper plating solution failed the thermal stress test. When the ratio was lower, namely 1.01, the additive printed circuit boards passed the thermal stress test.

EXAMPLE 14

An electroless copper plating solution was prepared with the following composition.

| Copper sulfate | 0.02 moles/l |
|---|---|
| Tetrakis(2-hydroxypropyl)ethylenediamine | 0.095 moles/l |

-continued

| | |
|---|---|
| Formaldehyde | 0.02 moles/l |
| pH | 12.6 at 25° C. |
| Cyanide (Orion 94-06 electrode vs SCE) | −135 mV |
| 2,2'-dipyridyl | 80 mg/l |

This solution was operated at four different temperatures with the following results.

| Temperature | °C. | 40 | 50 | 64 | 75 |
|---|---|---|---|---|---|
| Plating rate | μ/hr | 1.5 | 2.3 | 3.6 | unstable |
| $E_{mp}$ vs. SCE | mV | −765 | −757 | −750 | — |
| $r_a'$ | mA/cm² | 1.29 | 1.67 | 2.88 | — |
| $r_c'$ | mA/cm² | 1.38 | 1.95 | 3.24 | — |
| Ratio' | | 0.93 | 0.86 | 1.13 | — |

This demonstrates that while increasing the temperature increases the plating rate as is well known in the art, contrary to the previous teachings for electroless copper plating, increasing the temperature can change the ratio of the intrinsic anodic and cathodic reaction rates, to a ratio indicative for unsatisfactory copper deposits, and thus produce copper deposits susceptible to fissure formation.

EXAMPLE 15

A gravimetric test procedure is used to select an electroless copper plating solution formulation that operates under anodic control and deposits copper resistant to fissures or cracks when thermally stressed. The rate of the electroless plating reaction is determined by weighing the milligrams of copper per hour electrolessly deposited on a catalytic surface immersed in the electroless plating solution. When the plating rate changes as a function of the concentration of the cathodic reactants, i.e., copper ion concentration, the solution is under cathodic control; if it changes as a function of the concentration of anodic reactants, i.e., formaldehyde or pH, the plating solution operates under anodic control.

A suitable test surface is a stainless steel plaque with a surface area of 10 or 20 cm². The plaque is cleaned and immersed in a dilute solution (e.g. 0.1 g/l) of palladium chloride to insure the surface is catalytic. The plaque is then immersed in a electroless copper deposition solution for a period sufficient to deposit 1 to 10 milligrams of copper on the surface. At the end of the period the plaque, now plated with copper, is removed from the solution and rinsed and dried (e.g. 105° C. for 30 minutes). The plaque is weighed, the copper stripped from the plaque by immersion in nitric acid, and the plaque is rinsed, dried and reweighed to determine the weight of copper per hour deposited during the period of immersion in the deposition solution.

One liter test solutions are prepared with the following compositions:

| | | | |
|---|---|---|---|
| Copper sulfate | moles/l | 0.024 | 0.048 |
| EDTA | moles/l | 0.100 | 0.124 |
| Formaldehyde | moles/l | 0.267 | 0.267 |
| pH | 25° C. | 12.3 | 12.3 |
| $[CH_2O][OH^-]^{0.5}$ | (moles/l)$^{1.5}$ | 0.038 | 0.038 |
| Vanadium pentoxide | mg/l | 0.5 | 0.5 |
| Operating temperature | °C. | 30 | 30 |

Stainless steel plaques are prepared and immersed in the plating solutions. After one hour the plaques are removed and the amount of copper electrolessly deposited on each plaque is determined gravimetrically as described above. The plating rate for the solution containing 0.048 moles/l copper ion is faster than for the solution containing 0.024 moles/l. This demonstrates that the plating rate of the solutions is controlled by the cathodic reaction, and copper deposited from these formulations will not pass the thermal stress test.

Two additional solutions are prepared having the same formulation except that the formaldehyde concentration is 0.133 moles/l instead of 0.267 moles/l. Plaques are also plated in these solutions, and the plating rate of each solution is determined as described above. The plating rate of the solution containing 0.048 moles/l copper ion is faster that the plating rate of the solution with 0.024. Thus these solutions are also under cathodic control.

Two new solutions are prepared with same concentrations of copper sulfate and formaldehyde in both solutions, but varying the pH. The solution compositions are:

| | | | |
|---|---|---|---|
| Copper sulfate | moles/l | 0.026 | 0.026 |
| EDTA | moles/l | 0.100 | 0.100 |
| Formaldehyde | moles/l | 0.067 | 0.067 |
| pH | 25° C. | 12.2 | 12.4 |
| $[CH_2O][OH^-]^{0.5}$ | (moles/l)$^{1.5}$ | 0.008 | 0.011 |
| Vanadium pentoxide | mg/l | 0.5 | 0.5 |
| Operating temperature | °C. | 30 | 30 |

The plating solutions are gravimetrically tested as described above, and it is found that the plating rate increases as the pH increases. Thus the solutions are under anodic control.

These two solutions are prepared in larger volumes having the same formulations as the two solutions under anodic control above. Adhesive coated epoxy-glass base material provided with resist patterns and holes for through connections are electrolessly plated with copper in the two solutions to form additive printed circuit boards. After plating the additive printed circuit boards will pass the thermal shock test.

EXAMPLE 16

A solution is prepared with the following composition:

| | |
|---|---|
| Copper chloride | 0.056 moles/l |
| EDTA | 0.112 moles/l |
| Sodium hydroxide | to pH 12.4 (at 25° C.) |
| Sodium cyanide | 0.02 grams/l |
| Vanadium pentoxide | 0.003 grams/l |

The solution is divided into five beakers, and the five beakers are heated to 75° C. A quantity of formaldehyde is added to each beaker. 0.01 Moles/l formaldehyde is added to the first beaker, and 0.02, 0.04, 0.06 and 0.08 moles/l respectively to each of the other beakers.

The plating rate in each beaker is determined gravimetrically by the procedure described in Example 15. From the gravimetric measurements of the copper deposition rate it is determined that the plating rate levels off in the beakers containing 0.06 and 0.08 moles/l, i.e. the plating rate switches from anodic to cathodic control.

A plating solution is prepared containing 0.05 moles/l formaldehyde, and is used to deposit copper which when used to make printed circuit boards is capable of passing the thermal stress test.

What is claimed is:

1. In a method of depositing copper on a substrate with an electroless copper deposition solution including copper ions and a reducing agent for the copper ions, the improvement for producing a copper deposit which is essentially free of fissures comprising:
   a. establishing an electroless copper deposition solution comprising said copper ions and said reducing agent and operating the solution by adjusting the concentrations of anodic and cathodic reagents such that the ratio of its intrinsic anodic reaction rate to its intrinsic cathodic reaction rate is less than about 1.1;
   b. depositing copper with said electroless deposition solution on said substrate at said rate ratio; and
   c. controlling the operation of said deposition solution such that said ratio is substantially maintained throughout said copper deposition.

2. The method of claim 1, wherein said ratio is less than about 1.05.

3. The method of claim 1, wherein said ratio is less than about 1.0.

4. The method of claim 1, wherein said ratio is maintained by increasing the intrinsic cathodic rate relative to its intrinsic anodic rate.

5. The method of claim 4, wherein said deposition solution contains one or more contaminants and wherein said ratio is maintained by reducing the concentration said contaminants.

6. The method of claim 5, wherein the concentration of said contaminants are reduced by treating said deposition solution with active carbon.

7. The method of claim 5, wherein the concentration of said contaminants are reduced by replacing a portion of said deposition solution with an equivalent amount of said deposition solution which is essentially free of said contaminants.

8. The method of claim 4, wherein said intrinsic cathodic reaction rate is increased in said deposition solution by increasing said copper ion concentration and/or by adding a depolarizer for the cathodic reaction.

9. The method of claim 1, wherein said ratio is maintained by decreasing its intrinsic anodic rate relative to its intrinsic cathodic rate.

10. The method of claim 9, wherein said intrinsic anodic reaction rate is decreased in said deposition solution by decreasing the concentration of said reducing agent for the copper ions and/or by lowering the concentration of constituents which depolarize said intrinsic anodic reaction.

11. The method of claim 1, wherein said reducing agent for the copper ions is formaldehyde in the presence of hydroxide ions.

12. The method of claim 11, wherein said intrinsic anodic reaction rate is decreased by adjusting the concentration of either or both said formaldehyde ions and said hydroxide ions so that the product of the formaldehyde concentration and the square root of the hydroxide concentration is decreased.

13. The method of claim 10, wherein said reducing agent for the copper ions is formaldehyde in the presence of hydroxide ions and the constituents that reduce the intrinsic anodic reaction rate are selected from the group consisting of inorganic cyanides, organic nitriles, and vanadium compounds, aromatic heterocyclic nitrogen compounds and polyoxyethylene compounds.

14. The method of claim 1 wherein as the solution ages by build up of by-products, said ratio is maintained by increasing the concentration of copper ions and pH.

15. A method of formulating an electroless copper deposition solution capable of electrolessly depositing copper on a substrate the method comprising the steps of:
   a. forming a stable electroless copper deposition solution comprised of the following constituents: copper, one or more ligands to solubilize the copper, formaldehyde, an alkali metal hydroxide and one or more additives selected from accelerators, ductility promoters and surfactants;
   b. measuring the intrinsic anodic reaction rate of said deposition solution;
   c. measuring the intrinsic cathodic reaction rate of said deposition solution;
   d. whenever the ratio of the intrinsic anodic reaction rate to the intrinsic cathodic reaction rate is greater than or equal to 1.1, adjusting said ratio so that it is less than about 1.1;
   e. repeating steps b and c to determine whether said ratio is less than about 1.1; and
   f. repeating step d and then steps b and c until the measured ratio is less than about 1.1.

16. The method according to claim 15 wherein the ratio is adjusted by increasing the ratio of the intrinsic cathodic reaction rate relative to the intrinsic anodic reaction rate by increasing the copper concentration, by increasing the concentration of one or more of the additives and/or by decreasing the concentration of the formaldehyde and/or the alkali metal hydroxide.

17. A method of adjusting an electroless copper deposition solution to ensure that it will deposit copper on a substrate such that the copper electrolessly deposited is free of fissures, the deposition solution comprising copper, one or more ligands, formaldehyde, an alkali metal hydroxide, and one or more additives, said method comprising the step of:
   a. measuring the intrinsic anodic reaction rate of said deposition solution;
   b. measuring the intrinsic cathodic reaction rate of said deposition solution;
   c. comparing the measured rates to determine whether the ratio of said intrinsic anodic reaction rate to said cathodic plating rate; is less than about 1.1.
   d. adjusting the intrinsic anodic reaction rate so that said ratio is less than about 1.1.

18. A method of operating an electroless copper deposition solution comprising copper, one or more ligands, formaldehyde, an alkali metal hydroxide, and one or more additives, said method comprising the steps of:
   a. measuring the intrinsic anodic reaction rate of said deposition solution;
   b. measuring the intrinsic cathodic reaction rate of said deposition solution;
   c. comparing the measured rates to determine whether the ratio of said intrinsic anodic reaction rate to said cathodic reaction rate is less than about 1.1; and
   d. adjusting the concentration of the constituents of the solution so that said ratio is less than about 1.1.

19. A method as defined in claim 15, wherein said intrinsic anodic reaction rate of said deposition solution is adjusted by reducing the product of the concentration of formaldehyde and the square root of the concentration of alkali metal hydroxide present in said deposition solution.

20. The method of claim 19 wherein said intrinsic anodic reaction rate is adjusted by reducing the pH of said deposition solution.

21. The method of claim 17 wherein said intrinsic anodic reaction rate is adjusted by reducing the amount of formaldehyde present in said deposition solution.

22. The method of claim 15 wherein said intrinsic anodic reaction rate is adjusted by removing impurities from said deposition solution.

23. The method of claim 15 said intrinsic anodic reaction rate is adjusted by: lowering the pH of said deposition solution; reducing the amount of formaldehyde present in said deposition solution; removing impurities present in said deposition solution or combination thereof.

24. A method of controlling the commercial operation of an electroless copper deposition solution comprising copper, one or more ligands, formaldehyde, an alkali metal hydroxide, and one or more additives, the method comprising the steps of:
  a. measuring the intrinsic anodic reaction rate of said deposition solution;
  b. measuring the intrinsic cathodic reaction rate of said deposition solution;
  c. comparing the measured rates to determine whether the ratio of measured intrinsic cathodic reaction rate to the measured intrinsic anodic reaction rate is less than about 1.1;
  d. discontinuing commercial use of said deposition solution unless said ratio is less than about 1.1.

25. The method of claim 24 further includes the steps of:
  e. readjusting said intrinsic anodic reaction rate and/or said intrinsic cathodic reaction rate so that said ratio is less than about 1.1, and
  f. resuming commercial use of said deposition solution.

26. A method of adjusting an electroless copper deposition solution which has become contaminated causing reduction in deposition rate, quality of the copper deposit, or local passivation, to ensure that the solution will deposit copper on a substrate such that the copper electrolessly deposited is free of fissures, the deposition solution comprising copper, one or more ligands, formaldehyde, an alkali metal hydroxide, and one or more additives, said method comprising the steps of:
  a. increasing pH and/or formaldehyde concentration of the solution to increase the plating current produced by the anodic reaction;
  b. measuring the intrinsic anodic reaction rate of the solution;
  c. measuring the intrinsic cathodic reaction rate of said deposition solution;
  d. comparing the measured rates to determine whether the ratio of said intrinsic anodic reaction rate to said cathodic plating rate is returned to the ratio of the solution before contamination, or is less than 1.1.
  e. increasing the copper concentration of the solution; and
  f. adjusting the intrinsic cathodic rate so that said ratio is returned to the ratio before contamination or less than 1.1.

27. The method of claim 26 the intrinsic anode rate is adjusted by increasing the pH.

28. In a solution useful for electrolessly plating copper, said solution including copper ions, a complexing ligand to solubilize the copper ions, a pH adjuster in a concentration sufficient to adjacent the pH, a stabilizer or ductility promoter and a formaldehyde reducing agent, the improvement comprising:
  the concentration of the pH adjustor being sufficient to adjust the pH (as measured at 25° C.) to at least 11.9;
  an accelerator containing a delocalized pi bond, the accelerator being selected from among
    (i) heterocyclic aromatic nitrogen and sulfur compounds,
    (ii) non-aromatic nitrogen compounds having at least one delocalized pi bond, and
    (iii) aromatic amines and mixtures of the foregoing;
  the mole concentration of the formaldehyde reducing agent being no greater than 1.2 times the mole concentration of the copper ion, and
  the stabilizer or ductility promoter being present in an amount sufficient to prevent extraneous copper plating or spontaneous decomposition of the solution at said pH and formaldehyde concentration and substantially less than the amount that would stop the plating reaction at said pH and formaldehyde concentration.

29. A solution according to claim 28 wherein the concentration of the pH adjustor is sufficient to adjust the pH to at least 12.2.

30. A solution according to claim 28 wherein the mole concentration of the formaldehyde reducing agent is greater than the mole concentration of the copper ion.

31. A solution according to claim 28 wherein the concentration of the pH adjustor is sufficient to adjust the pH to at least 12.5.

32. A method of forming a copper deposit on a substrate, said copper deposit being substantially free of fissures, the method comprising:
  a. providing an electroless copper deposition solution which comprises copper ions, a complexing ligand to solubilize the copper ions, a stabilizer or ductility promoter in an amount sufficient to prevent extraneous copper plating or spontaneous decomposition of the solution and substantially less than the amount which would stop the electroless copper deposition reaction, a formaldehyde reducing agent wherein the mole concentration of the formaldehyde reducing agent is no greater than 1.2 times the mole concentration of the copper ions, the solution having a pH of at least 11.9 when measured at 25° C.;
  b. contacting the substrate with the solution for a time sufficient to form a deposit having a preselected deposit thickness;
  c. substantially maintaining the formaldehyde reducing agent concentration no greater than 1.2 times the concentration of copper ions during the time or deposition, and
  d. electrolessly depositing copper on the substrate.

33. A method according to claim 32 wherein the mole concentration of the formaldehyde reducing agent is no greater than the mole concentration of the copper ion.

34. A method according to claim 32 the solution further comprises an accelerator containing a delocaled pi bond which is selected from among
  (i) heterocyclic aromatic nitrogen and sulfur compounds, (ii) non-aromatic nitrogen compounds having at least one delocalized pi bond, and (iii) aromatic amines and mixtures of the foregoing.

35. A method according to claims 32 or 34 wherein the solution has a pH of at least 12.2.

36. A method according to claims 32 or 34 wherein the solution has a pH of at least 12.5.

37. A method according to claim 32 wherein as the solution ages in use by build up of by-products or by-products and contamination:
   a. the mole concentration of formaldehyde reducing agent in the solution is held substantially constant;
   b. pH is increased to maintain a constant rate of copper deposition on the surface.

38. A method according to claim 37 wherein the copper ion concentration and the pH are increased as the solution ages in use.

39. A method according to claim 37 wherein as the solution ages in use:
   a. the copper ion and hydroxide ion concentration are increased.
   b. the formaldehyde concentration is held substantially constant or reduced;

40. A method of operating an electroless cooper plating solution to maintain the quality of the copper deposit, and maintain a constant plating rate, the solution including copper ions, a formaldehyde reducing agent, a stabilizer, and hydroxide ions to establish an alkaline pH, said solution as it ages in use by build up of by-products of by-products and contamination tending to produce copper deposits which are subject to fissures, the method comprising:

increasing the copper ion concentration and the pH sufficient to maintain the quality of the copper deposit, and reducing the formaldehyde reduced agent concentration sufficient to maintain the plating rate constant.

41. A method of operating an electroless copper plating solution to maintain the quality of the copper deposit and maintain a constant plating rate, the solution including copper ions, a formaldehyde reducing agent, a stabilizer, and hydroxide ions to establish an alkaline pH, as said solution ages in use by build up of by-products or by-products and contamination and the quality of the copper deposit tending to decrease, the method comprising:

increasing the copper ion concentration and the pH sufficient to maintain constant a Ratio of the rate of an intrinsic anodic reaction to an intrinsic cathodic reaction, and reducing the formaldehyde reducing agent concentration sufficient to maintain the plating rate constant.

42. In a method of operating an electroless copper plating solution, the solution including copper ions, sufficient hydroxide ions to establish an alkaline pH, a formaldehyde reducing agent and a stabilizer, said solution tending to produce lower quality copper deposits as the solution ages, the improvement which comprises:

increasing the plating rate and maintaining the quality of the copper deposit as the solution ages by increasing the copper ion concentration and the pH sufficient to increase the plating rate, and maintaining substantially constant or reducing the concentration of the formaldehyde reducing agent by an amount sufficient to maintain the quality of the copper deposit.

* * * * *

UNITED STATES PATENT AND TRADEMARK OFFICE
CERTIFICATE OF CORRECTION

PATENT NO. : 4,908,242

DATED : March 13, 1990

INVENTOR(S) : Rowan Hughes, Milan Paunovic and Rudolph J. Zeblisky

It is certified that error appears in the above-identified patent and that said Letters Patent is hereby corrected as shown below:

In The Claims: Columns 31, 32 33 and 34:

Claim 23, lines 1, after "15" and before "said", insert --wherein--;

Claim 25, line 1 after "24" and before "further", insert --which--;

Claim 27, line 1 after "26" and before "the", insert --wherein--;

Claim 28, line 3, "adjuster" should read --adjustor--;

Claim 28, line 4, "adjacent" should read --adjust--;

Claim 30, line 3, after "is" and before "greater", insert --no--;

Claim 34, line 2, "delocaled" should read --delocalized--;

Claim 40, line 3, delete the comma ",";

Claim 40, line 7, "of" should read --or--;

Claim 40, line 13, "reduced" should read --reducing--.

UNITED STATES PATENT AND TRADEMARK OFFICE
CERTIFICATE OF CORRECTION

PATENT NO. : 4,908,242

DATED : March 13, 1990

INVENTOR(S) : Rowan Hughes, Milan Paunovic and Rudolph J. Zeblisky

It is certified that error appears in the above-identified patent and that said Letters Patent is hereby corrected as shown below:

Column 2, line 40, "$mA/cm_2$" should read --$mA/cm^2$--.

Signed and Sealed this

Twenty-ninth Day of October, 1991

Attest:

*Attesting Officer*

HARRY F. MANBECK, JR.

*Commissioner of Patents and Trademarks*